US012785637B2

(12) United States Patent
Choi

(10) Patent No.: US 12,785,637 B2
(45) Date of Patent: Nov. 3, 2026

(54) AMPLIFICATION CIRCUIT, AND RECEIVER CIRCUIT AND SEMICONDUCTOR APPARATUS USING AMPLIFICATION CIRCUIT

(71) Applicant: SK hynix Inc., Icheon-si (KR)

(72) Inventor: Sung Phil Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 332 days.

(21) Appl. No.: 18/733,133

(22) Filed: Jun. 4, 2024

(65) Prior Publication Data

US 2025/0219604 A1 Jul. 3, 2025

(30) Foreign Application Priority Data

Jan. 2, 2024 (KR) ........................ 10-2024-0000354

(51) Int. Cl.
*H03F 3/45* (2006.01)
*H03K 3/037* (2006.01)

(52) U.S. Cl.
CPC ......... *H03F 3/45269* (2013.01); *H03K 3/037* (2013.01)

(58) Field of Classification Search
CPC .. H03K 3/023; H03K 3/0233; H03K 3/02335; H03K 3/027; H03K 3/037; H03K 3/0375; H03F 3/45; H03F 3/45071; H03F 3/45076; H03F 3/45179; H03F 3/45183; H03F 3/45188; H03F 3/45269; G11C 7/06; G11C 7/062; G11C 7/065; G11C 7/1087; G11C 7/1096
See application file for complete search history.

(56) References Cited

U.S. PATENT DOCUMENTS 11,962,300 B2 * 4/2024 Hong ...................... H03K 3/037
2003/0094985 A1 * 5/2003 Heo ................. H03K 3/356139
327/202

FOREIGN PATENT DOCUMENTS

KR 1020230109527 A 7/2023

* cited by examiner

*Primary Examiner* — Long Nguyen
(74) *Attorney, Agent, or Firm* — WILLIAM PARK AND ASSOCIATES LTD.

(57) ABSTRACT

An amplification circuit is configured to differentially amplify an input signal and a reference voltage to generate an output signal when a clock signal has a first logic level. The amplification circuit is configured to precharge the output signal when the clock signal has a second logic level. The amplification circuit is configured to adjust a current driving force that precharges the output signal based on the reference voltage.

22 Claims, 11 Drawing Sheets

AMPLIFICATION CIRCUIT, AND RECEIVER CIRCUIT AND SEMICONDUCTOR APPARATUS USING AMPLIFICATION CIRCUIT

CROSS-REFERENCES TO RELATED APPLICATION

The present application claims priority under 35 U.S.C. § 119(a) to Korean Patent Application No. 10-2024-0000354, filed on Jan. 2, 2024, in the Korean Intellectual Property Office, which is incorporated herein by reference in its entirety.

BACKGROUND

1. Technical Field

Various embodiments generally relate to an integrated circuit technology, and more particularly, to an amplification circuit, and a receiver circuit and a semiconductor apparatus using the amplification circuit.

2. Related Art

An electronic device includes many electronic components. Among the electronic components, a computer system may include many semiconductor apparatuses manufactured by using semiconductor devices. The semiconductor apparatuses that constitute the computer system may communicate with each other by transmitting and receiving clocks and data. The semiconductor apparatuses may each include a receiver circuit and receive a signal from an external apparatus or receive a signal between circuits within the semiconductor apparatus. In general, the receiver circuit may include an amplifier that receives a pair of differential signals or a single-ended signal by performing a differential amplification operation. The amplifier may receive a signal by differentially amplifying a differential signal, and may receive a signal by differentially amplifying a single-ended signal and a reference voltage. As a semiconductor manufacturing process becomes fine, a parasitic capacitor may be formed between semiconductor devices that constitute the amplifier of the receiver circuit. The parasitic capacitors may generate kickback noise in nodes of the amplifier based on a change in the voltage level of an input signal of the amplifier, and may hinder the amplifier from performing an accurate sensing amplification operation by reducing a sensing margin of the amplifier.

SUMMARY

In an embodiment, an amplification circuit may include a prechage control circuit and an amplifier. The precharge control circuit may be configured to generate a precharge control signal based on a voltage level of a reference voltage. The amplifier may be configured to differentially amplify an input signal and the reference voltage to change voltage levels of a positive output node and a negative output node when a clock signal has a first logic level, to precharge the positive output node and the negative output node when the clock signal has a second logic level, and to adjust a current driving force that precharges the positive output node and the negative output node based on the precharge control signal.

In an embodiment, an amplification circuit may include an enable circuit, an input circuit, and a precharge circuit. The enable circuit may be configured to apply a first voltage to a common node when a clock signal has a first logic level. The input circuit may be coupled between the common node, and a positive output node and a negative output node. The input circuit may be configured to change voltage levels of the positive output node and the negative output node based on an input signal and a reference voltage. The precharge circuit may be configured to precharge the positive output node and the negative output node to a voltage level of a second voltage when the clock signal has a second logic level and to adjust a current current driving force that precharges the positive output node and the negative output node based on a voltage level of the reference voltage.

In an embodiment, a receiver circuit may include a first amplifier and a second amplifier. The first amplifier may be configured to differentially amplify an input signal and a reference voltage to generate a first amplification signal when a clock signal has a first logic level, to precharge the first amplification signal when the clock signal has a second logic level, and to adjust a current driving force that precharges the first amplification signal based on a voltage level of the reference voltage. The second amplifier may be configured to differentially amplify the input signal and the reference voltage to generate a second amplification signal when the clock signal has the second logic level, to precharge the second amplification signal when the clock signal has the first logic level, and to adjust a current driving force that precharges the second amplification signal based on the voltage level of the reference voltage.

DETAILED DESCRIPTION

Figure 1A:
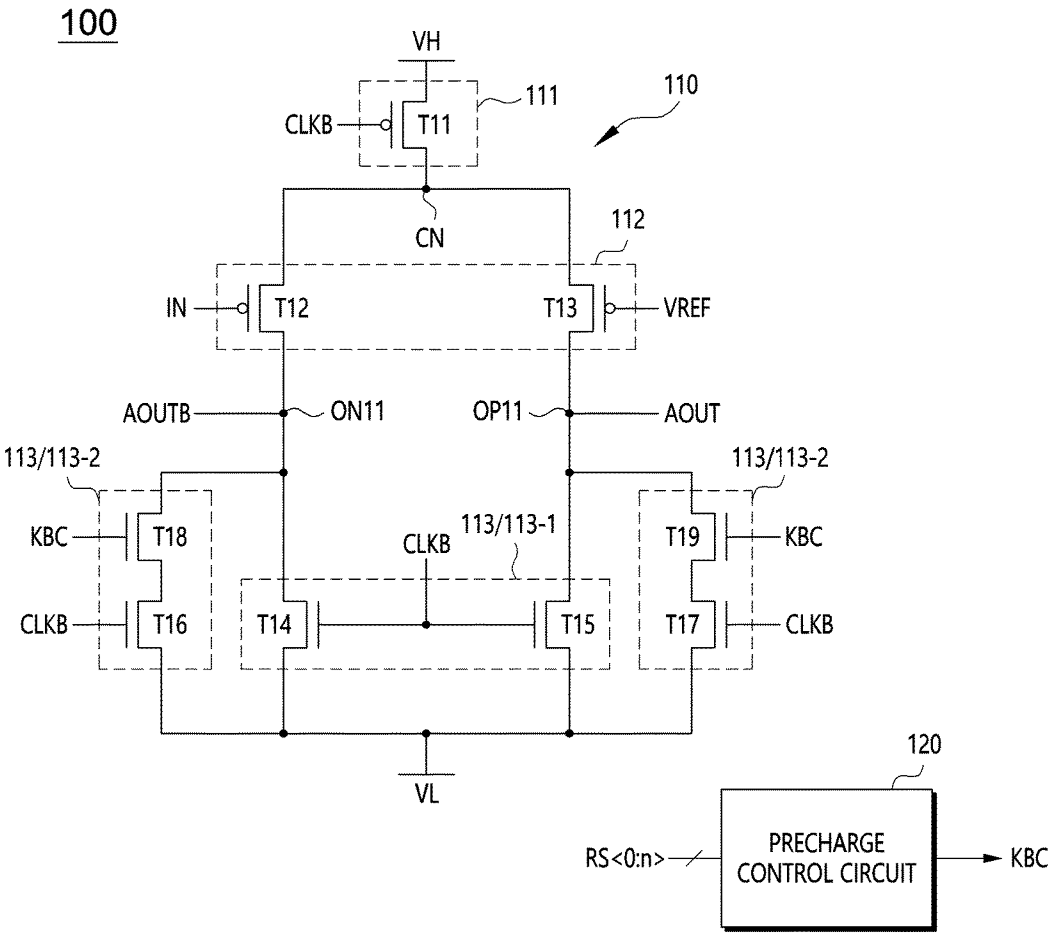
FIG. 1A is a diagram illustrating a configurations of an amplification circuit according to an embodiment.

FIG. 1A is a diagram illustrating a configurations of an amplification circuit 100 according to an embodiment. Referring to FIG. 1A, the amplification circuit 100 may generate an amplification signal AOUT by receiving an input signal IN. The input signal IN may be a single-ended signal. The amplification circuit 100 may receive a reference voltage VREF that is used to receive the input signal IN. The reference voltage VREF may have a voltage level between the highest voltage level and the lowest voltage level in a range in which the input signal IN swings. The amplification circuit 100 may generate the amplification signal AOUT by differentially amplifying the input signal IN and the reference voltage VREF. The amplification circuit 100 may generate a complementary amplification signal AOUTB along with the amplification signal AOUT. The amplification circuit 100 may receive a first clock signal CLKB, and may operate in synchronization with the first clock signal CLKB. When the first clock signal CLKB has a first logic level, the amplification circuit 100 may perform an amplification operation, and may generate the amplification signal AOUT by differentially amplifying the input signal IN and the reference voltage VREF. The amplification circuit 100 may operate by receiving a first voltage VH and a second voltage VL. The first voltage VH may have a higher voltage level than the second voltage VL. The amplification circuit 100 may generate an output signal having a voltage level between the first voltage VH and the second voltage VL by differentially amplifying the input signal IN and the reference voltage VREF. When the first clock signal CLKB has a second logic level, the amplification circuit 100 may perform a precharge operation and precharge the amplification signal AOUT. The amplification circuit 100 may precharge the amplification signal AOUT to the voltage level of the second voltage VL. The amplification circuit 100 may adjust a current driving force and/or a driver strength that precharges the amplification signal AOUT based on the voltage level of the reference voltage VREF. The amplification circuit 100 may sense the voltage level of the reference voltage VREF, and may adjust the current driving force that precharges the amplification signal AOUT based on the results of the detection. The current driving force may refer to an amount of current that precharge the amplification signal AOUT. For example, when the reference voltage VREF has a higher voltage level than a threshold value, the amplification circuit 100 may increase or decrease the current driving force that precharges the amplification signal AOUT. In an embodiment, an amount of current that precharges the amplification signal AOUT may be increased or decreased. When the reference voltage VREF has a lower voltage level than the threshold value, the amplification circuit 100 may decrease or increase the current driving force that precharges the amplification signal AOUT. In an embodiment, an amount of current that precharges the amplification signal AOUT may be decreased or increased.

The amplification circuit 100 may include an amplifier 110 and a precharge control circuit 120. In an embodiment, the amplifier 110 may include a precharge driver 113, a differential circuit 112, and an enable circuit 111. The amplifier 110 may receive the first clock signal CLKB, the input signal IN, and the reference voltage VREF. The amplifier 110 may generate the amplification signal AOUT by differentially amplifying the input signal IN and the reference voltage VREF based on the logic level of the first clock signal CLKB. When the first clock signal CLKB has a first logic level, the amplifier 110 may generate the amplification signal AOUT by differentially amplifying the input signal IN and the reference voltage VREF. The amplifier 110 may generate the amplification signal AOUT and the complementary amplification signal AOUTB by changing the voltage levels of a positive output node OP11 and a negative output node ON11 based on the input signal IN and the reference voltage VREF. The amplification signal AOUT may be output from the positive output node OP11. The complementary amplification signal AOUTB may be output from the negative output node ON11. When the first clock signal CLKB has a second logic level, the amplifier 110 may precharge the amplification signal AOUT without differentially amplifying the input signal IN and the reference voltage VREF. When the first clock signal CLKB has the second logic level, the amplifier 110 may precharge the positive output node OP11 and the negative output node ON11. The amplifier 110 may adjust a current driving force that precharges the amplification signal AOUT and the complementary amplification signal AOUTB and/or the positive output node OP11 and the negative output node ON11, based on the voltage level of the reference voltage VREF. For example, the amplifier 110 may be a P type amplifier. In an embodiment a P type amplifier may include a differential circuit including PMOS transistors. For example, the amplifier 110 may include a differential circuit 112 including PMOS (p-channel metal-oxide semiconductor (pMOS)) transistors T12 and T13. When the reference voltage VREF has a higher voltage level than a threshold value, the amplifier 110 may increase a current driving force that precharges the positive output node OP11 and the negative output node ON11. In an embodiment, when the reference voltage VREF has a higher voltage level than the threshold value, an amount of current flowing from the positive output node OP11 and the negative output node ON11 may be increased. When the reference voltage VREF has a lower voltage level than the threshold value, the amplifier 110 may decrease the current driving force that precharges the positive output node OP11 and the negative output node ON11. In an embodiment, when the reference voltage VREF has a lower voltage level than the threshold value, an amount of current flowing from the positive output node OP11 and the negative output node ON11 may be decreased. The amplifier 110 may adjust the current driving force that precharges the positive output node OP11 and the negative output node ON11 by receiving a precharge control signal KBC.

The precharge control circuit 120 may generate the precharge control signal KBC by sensing the voltage level of the reference voltage VREF. The precharge control circuit 120 may generate the precharge control signal KBC by sensing the voltage level of the reference voltage VREF in various ways. The precharge control circuit 120 may receive a reference voltage setting signal RS<0:n>, and may generate the precharge control signal KBC by sensing the logic value of the reference voltage setting signal RS<0:n>. In this case, n may be an integer equal to or greater than 1. The reference voltage setting signal RS<0:n> may be a signal having information with regard to the voltage level of the reference voltage VREF. A semiconductor apparatus including the amplification circuit 100 may include a reference voltage generation circuit that generates the reference voltage VREF. The reference voltage generation circuit may generate a reference voltage having a voltage level corresponding to the logic value of the reference voltage setting signal RS<0:n>. The reference voltage setting signal RS<0:n> may be a signal that is provided by an external apparatus of the semiconductor apparatus, and may be information that has been stored in a register within the semiconductor apparatus. The precharge control circuit 120 may compare the logic value of the reference voltage setting signal RS<0:n> and a threshold value. For example, as the logic value of the reference voltage setting signal RS<0:n> is increased, the reference voltage VREF may have a higher voltage level. When the logic value of the reference voltage setting signal RS<0:n> is greater than the threshold value (i.e., when the reference voltage VREF has a higher voltage level than the threshold value), the precharge control circuit 120 may enable the precharge control signal KBC. When the logic value of the reference voltage setting signal RS<0:n> is smaller than the threshold value (i.e., when the reference voltage VREF has a lower voltage level than the threshold value), the precharge control circuit 120 may disable the precharge control signal KBC. In an embodiment, the precharge control circuit 120 may receive the reference voltage VREF, and may be modified to generate the precharge control signal KBC by sensing the voltage level itself of the reference voltage VREF. The precharge control circuit 120 may generate the precharge control signal KBC by directly comparing the voltage level of the reference voltage VREF and the threshold value.

The amplifier 110 may include an enable circuit 111, a differential circuit 112, and a precharge driver 113. The enable circuit 111 may be coupled between a terminal to which the first voltage VH is supplied and a common node CN. The enable circuit 111 may receive the first clock signal CLKB, and may apply the first voltage VH to the common node CN based on the first clock signal CLKB. When the first clock signal CLKB has a first logic level, the enable circuit 111 may apply the first voltage VH to the common node CN. When the first clock signal CLKB has a second logic level, the enable circuit 111 might not apply the first voltage VH to the common node CN. For example, the first logic level may be a logic low level, and the second logic level may be a logic high level.

The differential circuit 112 may be coupled between the common node CN, and the positive output node OP11 and the negative output node ON11. The differential circuit 112 may receive the input signal IN and the reference voltage VREF, and may change the voltage levels of the positive output node OP11 and the negative output node ON11 based on the input signal IN and the reference voltage VREF. The differential circuit 112 may change the voltage level of the negative output node ON11 based on the input signal IN, and may change the voltage level of the positive output node OP11 based on the reference voltage VREF. For example, when the input signal IN has a higher voltage level than the reference voltage VREF, the differential circuit 112 may raise the voltage level of the positive output node OP11 by increasing the amount of current that flows from the common node CN to the positive output node OP11. As the voltage level of the positive output node OP11 rises, the amplification signal AOUT having a logic high level may be output through the positive output node OP11, and the complementary amplification signal AOUTB having a logic low level may be output through the negative output node ON11. When the input signal IN has a lower voltage level than the reference voltage VREF, the differential circuit 112 may raise the voltage level of the negative output node ON11 by increasing the amount of current that flows from the common node CN to the negative output node ON11. As the voltage level of the negative output node ON11 rises, the amplification signal AOUT having a logic low level may be output through the positive output node OP11, and the complementary amplification signal AOUTB having a logic high level may be output through the negative output node ON11.

The precharge driver 113 may be coupled between the positive output node OP11 and the negative output node ON11, and a terminal to which the second voltage VL is supplied. The precharge driver 113 may receive the first clock signal CLKB and the precharge control signal KBC, and may precharge the positive output node OP11 and the negative output node ON11 to the voltage level of the second voltage VL based on the first clock signal CLKB and the precharge control signal KBC. The precharge driver 113 may precharge the positive output node OP11 and the negative output node ON11 to the voltage level of the second voltage VL based on the first clock signal CLKB, and may adjust a current driving force that precharges the amplification signal AOUT and the complementary amplification signal AOUTB and/or a current driving force that drives the positive output node OP11 and the negative output node ON11 to the voltage level of the second voltage VL based on the precharge control signal KBC. When the precharge control signal KBC is enabled, the precharge driver 113 may increase the current driving force that drives the amplification signal AOUT and the complementary amplification signal AOUTB and/or the current driving force that precharges the positive output node OP11 and the negative output node ON11 to the voltage level of the second voltage VL. When the precharge control signal KBC is disabled, the precharge driver 113 may decrease the current driving force that precharges the amplification signal AOUT and the complementary amplification signal AOUTB and/or the current driving force that drives the positive output node OP11 and the negative output node ON11 to the voltage level of the second voltage VL. In an embodiment, the precharge driver 113, together with the precharge control circuit 120, may constitute a precharge circuit. The amplification circuit 100 may consist of the enable circuit 111, the differential circuit 112, and the precharge circuit.

The precharge driver 113 may include a first driver 113-1 and a second driver 113-2. In an embodiment, the part of the precharge driver 113 including the first driver 113-1 is identified as 113/113-1 in FIG. 1A and the parts of the precharge driver 113 including the second driver 113-2 is identified as 113/113-2 in FIG. 1A. The first driver 113-1 may be coupled between the positive output node OP11 and the negative output node ON11, and the terminal to which the second voltage VL is supplied. The first driver 113-1 may receive the first clock signal CLKB, and may drive and/or precharge the positive output node OP11 and the negative output node ON11 to the voltage level of the second voltage VL based on the first clock signal CLKB. When the first clock signal CLKB has a second logic level, the first driver 113-1 may precharge the positive output node OP11 and the negative output node ON11. The second driver 113-2 may be coupled between the positive output node OP11 and the negative output node ON11, and the terminal to which the second voltage VL is supplied. The second driver 113-2 may receive the first clock signal CLKB and the precharge control signal KBC, and may drive and/or precharge the positive output node OP11 and the negative output node ON11 to the voltage level of the second voltage VL based on the first clock signal CLKB and the precharge control signal KBC. For example, when the first clock signal CLKB has the second logic level and the precharge control signal KBC is enabled, the second driver 113-2 may precharge the positive output node OP11 and the negative output node ON11.

The enable circuit 111 may include a first transistor T11. The first transistor T11 may be a P channel metal-oxide semiconductor (MOS) transistor. The first transistor T11 may receive the first clock signal CLKB through a gate thereof. A source of the first transistor T11 may be coupled to the terminal to which the first voltage VH is supplied. A drain of the first transistor T11 may be coupled to the common node CN.

The differential circuit 112 may include a second transistor T12 and a third transistor T13. The second and third transistors T12 and T13 may each be a P channel MOS transistor. The second transistor T12 may receive the input signal IN through a gate thereof. A source of the second transistor T12 may be coupled to the common node CN. A drain of the second transistor T12 may be coupled to the negative output node ON11. The third transistor T13 may receive the reference voltage VREF through a gate thereof. A source of the third transistor T13 may be coupled to the common node CN. A drain of the third transistor T13 may be coupled to the positive output node OP11.

The first driver 113-1 may include a fourth transistor T14 and a fifth transistor T15. The fourth and fifth transistors T14 and T15 may each be an N channel MOS transistor. The fourth transistor T14 may receive the first clock signal CLKB through a gate thereof. A drain of the fourth transistor T14 may be coupled to the negative output node ON11. A source of the fourth transistor T14 may be coupled to the terminal to which the second voltage VL is supplied. The fifth transistor T15 may receive the first clock signal CLKB through a gate thereof. A drain of the fifth transistor T15 may be coupled to the positive output node OP11. A source of the fifth transistor T15 may be coupled to the terminal to which the second voltage VL is supplied.

The second driver 113-2 may include a sixth transistor T16, a seventh transistor T17, an eighth transistor T18, and a ninth transistor T19. The sixth to ninth transistors T16, T17, T18, and T19 may each be an N channel MOS transistor. The sixth transistor T16 may receive the first clock signal CLKB through a gate thereof. A source of the sixth transistor T16 may be coupled to the terminal to which the second voltage VL is supplied. The seventh transistor T17 may receive the first clock signal CLKB through a gate thereof. A source of the seventh transistor T17 may be coupled to the terminal to which the second voltage VL is supplied. The eighth transistor T18 may receive the precharge control signal KBC through a gate thereof. A drain of the eighth transistor T18 may be coupled to the negative output node ON11. A source of the eighth transistor T18 may be coupled to a drain of the sixth transistor T16. The ninth transistor T19 may receive the precharge control signal KBC through a gate thereof. A drain of the ninth transistor T19 may be coupled to the positive output node OP11. A source of the ninth transistor T19 may be coupled to a drain of the seventh transistor T17.

Figure 1B:
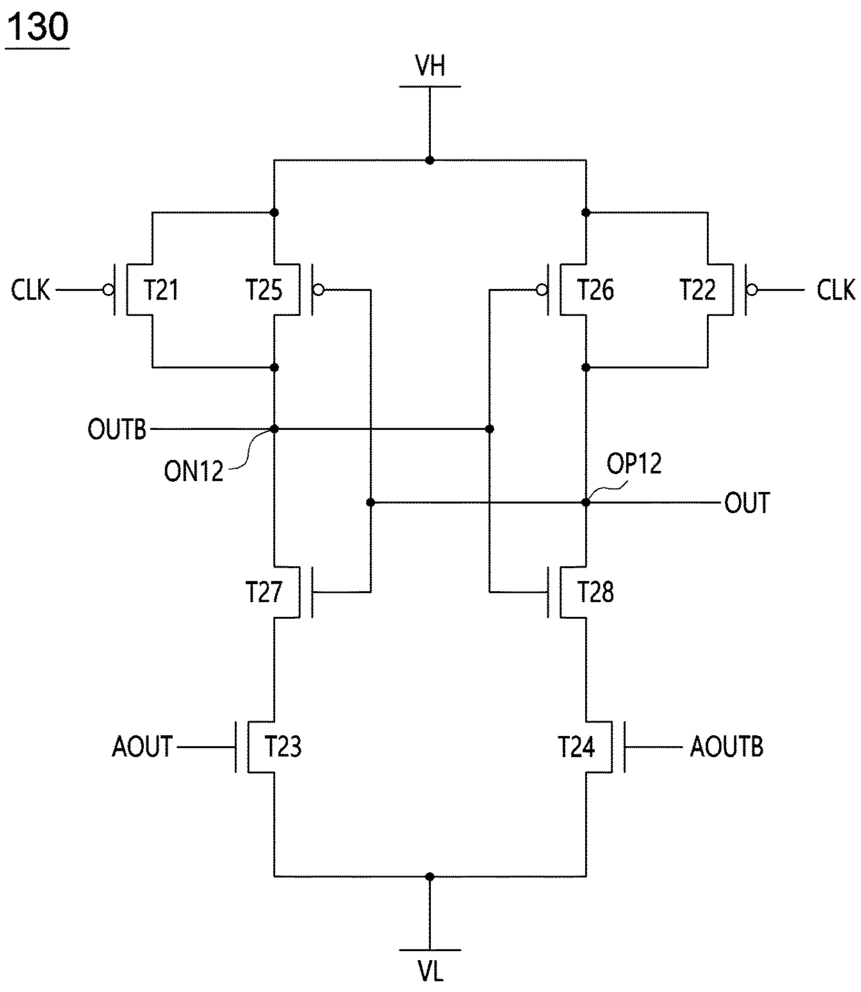
FIG. 1B is a diagram illustrating a configurations of a latch circuit according to an embodiment.

FIG. 1B is a diagram illustrating a configurations of a latch circuit 130 according to an embodiment. The latch circuit 130 may operate by being coupled to the amplifier 110 illustrated in FIG. 1A. The latch circuit 130, together with the amplifier 110 and the precharge control circuit 120, may constitute the amplification circuit 100. The amplifier 110 may operate as a first stage, and the latch circuit 130 may operate as a second stage. The latch circuit 130 may generate an output signal OUT and a complementary output signal OUTB by receiving the amplification signal AOUT and the complementary amplification signal AOUTB from the amplifier 110. The latch circuit 130 may change the voltage levels of the output signal OUT and the complementary output signal OUTB and maintain the voltage levels of the output signal OUT and the complementary output signal OUTB, based on the amplification signal AOUT and the complementary amplification signal AOUTB. The latch circuit 130 may receive a second clock signal CLK. The second clock signal CLK may be a complementary clock signal of the first clock signal CLK. The latch circuit 130 may perform amplification and latch operations based on the second clock signal CLK. When the second clock signal CLK has a first logic level, the latch circuit 130 may precharge the output signal OUT and the complementary output signal OUTB. When the second clock signal CLK has a second logic level, the latch circuit 130 may change the voltage levels of the output signal OUT and the complementary output signal OUTB based on the voltage levels of the positive output node OP12 and/or the amplification signal AOUT and the negative output node ON12 and/or the complementary amplification signal AOUTB.

The latch circuit 130 may include a first transistor T21, a second transistor T22, a third transistor T23, a fourth transistor T24, a fifth transistor T25, a sixth transistor T26, a seventh transistor T27, and an eighth transistor T28. The latch circuit 130 may be an N type latch circuit in which transistors that receive the amplification signal AOUT and the complementary amplification signal AOUTB are N channel MOS transistors, respectively. The first, second, fifth, and sixth transistors T21, T22, T25, and T26 may each be a P channel MOS transistor. The third, fourth, seventh, and eighth transistors T23, T24, T27, and T28 may each be an N channel MOS transistor. The first transistor T21 may receive the second clock signal CLK through a gate thereof. A source of the first transistor T21 may be coupled to the terminal to which the first voltage VH is supplied. A drain of the first transistor T21 may be coupled to a negative output node ON12. The second transistor T22 may receive the second clock signal CLK through a gate thereof. A source of the second transistor T22 may be coupled to the terminal to which the first voltage VH is supplied. A drain of the second transistor T22 may be coupled to a positive output node OP12. The output signal OUT may be output from the positive output node OP12. The complementary output signal OUTB may be output from the negative output node ON12.

The third transistor T23 may receive the amplification signal AOUT through a gate thereof. A source of the third transistor T23 may be coupled to the terminal to which the second voltage VL is supplied. The fourth transistor T24 may receive the complementary amplification signal AOUTB through a gate thereof. A source of the fourth transistor T24 may be coupled to the terminal to which the second voltage VL is supplied. A gate of the fifth transistor T25 may be coupled to the positive output node OP12. A source of the fifth transistor T25 may be coupled to the terminal to which the first voltage VH is supplied. A drain of the fifth transistor T25 may be coupled to the negative output node ON12. A gate of the sixth transistor T26 may be coupled to the negative output node ON12. A source of the sixth transistor T26 may be coupled to the terminal to which the first voltage VH is supplied. A drain of the sixth transistor T26 may be coupled to the positive output node OP12. A gate of the seventh transistor T27 may be coupled to the positive output node OP12. A drain of the seventh transistor T27 may be coupled to the negative output node ON12. A source of the seventh transistor T27 may be coupled to a drain of the third transistor T23. A gate of the eighth transistor T28 may be coupled to the negative output node ON12. A drain of the eighth transistor T28 may be coupled to the positive output node OP12. A source of the eighth transistor T28 may be coupled to a drain of the fourth transistor T24.

When the second clock signal CLK has a logic low level, the first and second transistors T21 and T22 may be turned on, and the first and second transistors T21 and T22 may precharge the positive output node OP12 and the negative output node ON12 to the voltage level of the first voltage VH. When the second clock signal CLK has a logic high level, the first and second transistors T21 and T22 may be turned off, and the latch circuit 130 may change the voltage levels of the positive output node OP12 and the negative output node ON12 based on the voltage levels of the amplification signal AOUT and the complementary amplification signal AOUTB. When the amplification signal AOUT has a higher voltage level than the complementary amplification signal AOUTB, the voltage level of the negative output node ON12 may be lower than the voltage level of the positive output node OP12 because the amount of current that flows through the seventh transistor T27 is greater than the amount of current that flows through the eighth transistor T28. Accordingly, the positive output node OP12 and/or the output signal OUT may be driven to a logic high level and the negative output node ON12 and/or the complementary output signal OUTB may be driven to a logic low level because the sixth and seventh transistors T26 and T27 maintain a turn-on state. When the amplification signal AOUT has a lower voltage level than the complementary amplification signal AOUTB, the voltage level of the negative output node ON12 may be higher than the voltage level of the positive output node OP12 because the amount of current that flows through the seventh transistor T27 is smaller than the amount of current that flows through the eighth transistor T28. Accordingly, the positive output node OP12 and/or the output signal OUT may be driven to a logic low level and the negative output node ON12 and/or the complementary output signal OUTB may be driven to a logic high level because the fifth and eighth transistors T25 and T28 maintain a turn-on state. The latch circuit 130 may maintain the voltage levels of the positive output node OP12 and the negative output node ON12 until the logic level of the second clock signal CLK is changed to a logic low level.

Figure 2A:
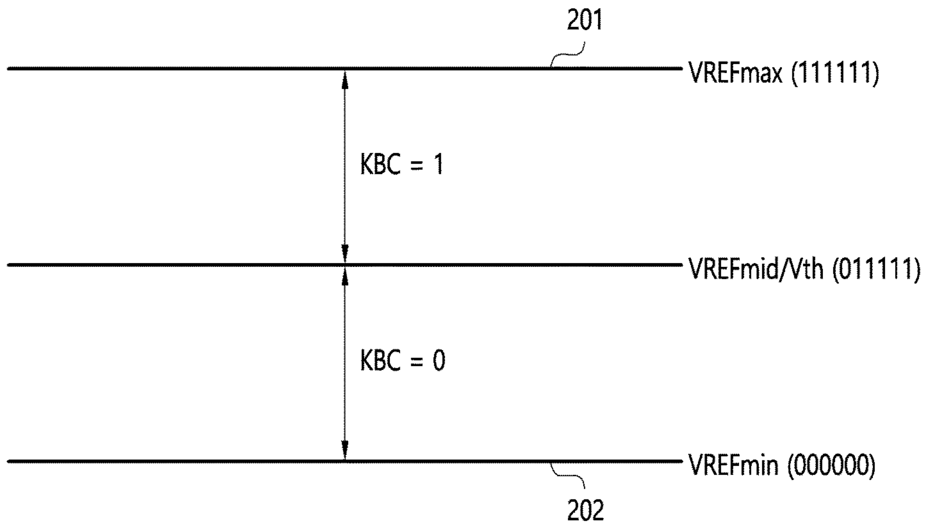
FIGS. 2A, 2B, and 2C are diagrams illustrating an operation of a precharge control circuit illustrated in FIG. 1.
Figure 2B:
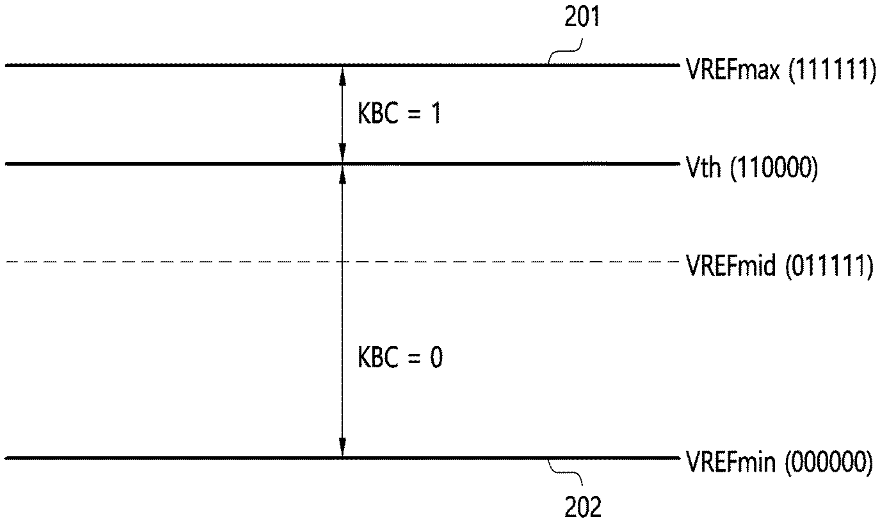
Figure 2C:
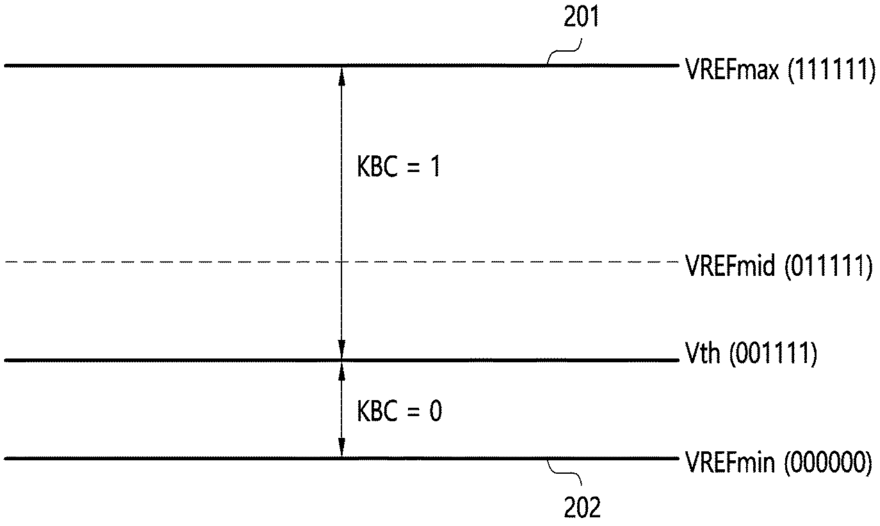

FIGS. 2A to 2C are diagrams illustrating an operation of the precharge control circuit 120 illustrated in FIG. 1A. A solid line 201 at the top of FIG. 2A may be the highest voltage level VREFmax of the reference voltage VREF. When the reference voltage setting signal RS<0:n> includes 6 bits, a logic value corresponding to the highest voltage level VREFmax may be 111111. A solid line 202 at the bottom of FIG. 2A may be the lowest voltage level VREFmin of the reference voltage VREF. A logic value corresponding to the lowest voltage level VREFmin may be 000000. A middle between the highest voltage level VREFmax and the lowest voltage level VREFmin may be a middle voltage level VREFmid. A logic value corresponding to the middle voltage level VREFmid may be 011111. A threshold value Vth may be the same as the middle voltage level VREFmid. When the logic value of the reference voltage setting signal RS<0:n> that is received by the precharge control circuit 120 is between the logic value corresponding to the highest voltage level VREFmax and the logic value corresponding to the threshold value Vth, the precharge control circuit 120 may enable the precharge control signal KBC to a logic high level. When the logic value of the reference voltage setting signal RS<0:n> that is received by the precharge control circuit 120 is between the logic value corresponding to the threshold value Vth and the logic value corresponding to the lowest voltage level VREFmin, the precharge control circuit 120 may disable the precharge control signal KBC to a logic low level.

The threshold value Vth may be variously changed between the highest voltage level VREFmax and the lowest voltage level VREFmin. Referring to FIG. 2B, the threshold value Vth may have a voltage level higher than the middle voltage level VREFmid. A logic value corresponding to the threshold value Vth may be 110000. When the logic value of the reference voltage setting signal RS<0:n> that is received by the precharge control circuit 120 is between the logic value corresponding to the highest voltage level VREFmax and the logic value corresponding to the threshold value Vth, the precharge control circuit 120 may enable the precharge control signal KBC to a logic high level (i.e., KBC=1). When the logic value of the reference voltage setting signal RS<0:n> that is received by the precharge control circuit 120 is between the logic value corresponding to the threshold value Vth and the logic value corresponding to the lowest voltage level VREFmin, the precharge control circuit 120 may disable the precharge control signal KBC to a logic low level (i.e., KBC=0).

Referring to FIG. 2C, the threshold value Vth may have a lower voltage level than the middle voltage level VREFmid. A logic value corresponding to the threshold value Vth may be 001111. When the logic value of the reference voltage setting signal RS<0: n> that is received by the precharge control circuit 120 is between the logic value corresponding to the highest voltage level VREFmax and the logic value corresponding to the threshold value Vth, the precharge control circuit 120 may enable the precharge control signal KBC to a logic high level. When the logic value of the reference voltage setting signal RS<0:n> that is received by the precharge control circuit 120 is between the logic value corresponding to the threshold value Vth and the logic value corresponding to the lowest voltage level VREFmin, the precharge control circuit 120 may disable the precharge control signal KBC to a logic low level.

Figure 3A:
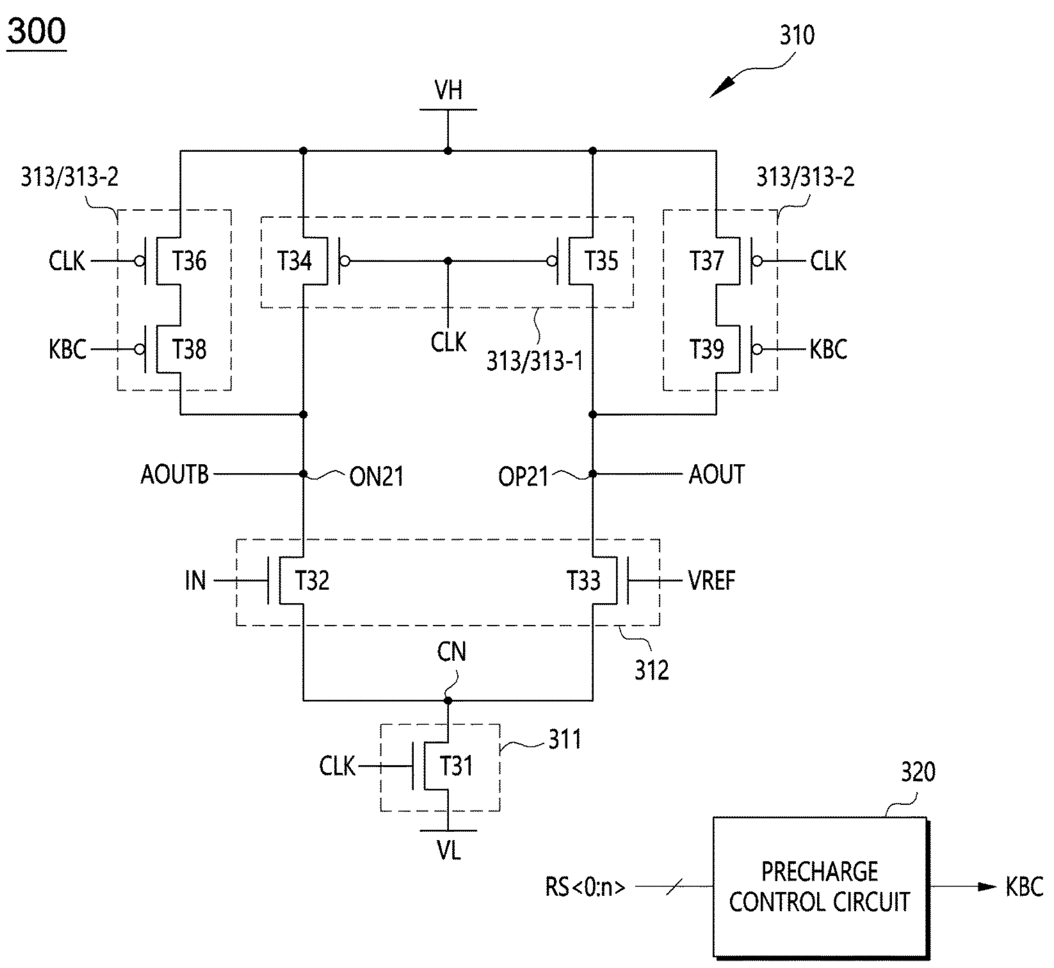
FIG. 3A is a diagram illustrating a configurations of an amplification circuit according to an embodiment.

FIG. 3A is a diagram illustrating a configurations of an amplification circuit 300 according to an embodiment. The amplification circuit 100 illustrated in FIG. 1A may include a P type amplifier, whereas the amplification circuit 300 may include an N type amplifier. Referring to FIG. 3A, the amplification circuit 300 may include an amplifier 310 and a precharge control circuit 320. The amplifier 310 may receive a second clock signal CLK, an input signal IN, and a reference voltage VREF. The amplifier 310 may generate an amplification signal AOUT by differentially amplifying the input signal IN and the reference voltage VREF based on the logic level of the second clock signal CLK. When the second clock signal CLK has a first logic level, the amplifier 310 may generate the amplification signal AOUT by differentially amplifying the input signal IN and the reference voltage VREF. The amplifier 310 may generate the amplification signal AOUT and a complementary amplification signal AOUTB by changing the voltage levels of a positive output node OP21 and a negative output node ON21 based on the input signal IN and the reference voltage VREF. When the second clock signal CLK has a second logic level, the amplifier 310 may precharge the amplification signal AOUT and the complementary amplification signal AOUTB without differentially amplifying the input signal IN and the reference voltage VREF. When the second clock signal CLK has the second logic level, the amplifier 310 may precharge the positive output node OP21 and the negative output node ON21. The amplifier 310 may adjust a current driving force that precharges the amplification signal AOUT and the complementary amplification signal AOUTB and/or the positive output node OP21 and the negative output node ON22 based on the voltage level of the reference voltage VREF. For example, the amplifier 310 may be an N type amplifier. In an embodiment an N type amplifier may include a differential circuit including NMOS (n-channel metal-oxide semiconductor (nMOS)) transistors. For example, the amplifier 310 may include a differential circuit 312 including NMOS transistors T32 and T33. When the reference voltage VREF has a higher voltage level than a threshold value, the amplifier 310 may decrease the current driving force that precharges the positive output node OP21 and the negative output node ON21. In an embodiment, when the reference voltage VREF has a higher voltage level than the threshold value, an amount of current flowing into the positive output node OP11 and the negative output node ON11 may be decreased. When the reference voltage VREF has a lower voltage level than the threshold value, the amplifier 310 may increase the current driving force that precharges the positive output node OP21 and the negative output node ON21. In an embodiment, when the reference voltage VREF has a lower voltage level than the threshold value, an amount of current flowing into the positive output node OP11 and the negative output node ON11 may be increased. The amplifier 310 may adjust the current driving force that precharges the positive output node OP21 and the negative output node ON21 by receiving a precharge control signal KBC.

The precharge control circuit 320 may receive a reference voltage setting signal RS<0:n>, and may generate the precharge control signal KBC based on the reference voltage setting signal RS<0:n>. The precharge control circuit 320 may be substantially the same as the precharge control circuit 120 illustrated in FIG. 1A, and may operate as illustrated in FIGS. 2A to 2C. When the reference voltage VREF has a higher voltage level than a threshold value (i.e., when the logic value of the reference voltage setting signal RS<0:n> is greater than a logic value corresponding to the threshold value), the precharge control circuit 320 may disable the precharge control signal KBC to a logic high level. When the reference voltage VREF has a lower voltage level than the threshold value (i.e., when the logic value of the reference voltage setting signal RS<0:n> is smaller than a logic value corresponding to the threshold value), the precharge control circuit 320 may enable the precharge control signal KBC to a logic low level.

The amplifier 310 may include an enable circuit 311, a differential circuit 312, and a precharge driver 313. The enable circuit 311 may be coupled between a terminal to which a second voltage VL is supplied and a common node CN. The enable circuit 311 may receive the second clock signal CLK, and may apply the second voltage VL to the common node CN based on the clock signal CLK. When the second clock signal CLK has a first logic level, the enable circuit 311 may apply the second voltage VL to the common node CN. When the second clock signal CLK has a second logic level, the enable circuit 311 might not apply the second voltage VL to the common node CN. For example, the first logic level may be a logic high level, and the second logic level may be a logic low level.

The differential circuit 312 may be coupled between the common node CN, and the positive output node OP21 and the negative output node ON21. The differential circuit 312 may receive the input signal IN and the reference voltage VREF, and may change the voltage levels of the positive output node OP21 and the negative output node ON21 based on the input signal IN and the reference voltage VREF. The amplification signal AOUT may be output from the positive output node OP21. The complementary amplification signal AOUTB may be output from the negative output node ON21. The differential circuit 312 may change the voltage level of the negative output node ON21 based on the input signal IN, and may change the voltage level of the positive output node OP21 based on the reference voltage VREF. For example, when the input signal IN has a higher voltage level than the reference voltage VREF, the differential circuit 312 may drop the voltage level of the negative output node ON21 by increasing the amount of current that flows from the negative output node ON21 to the common node CN. As the voltage level of the negative output node ON21 drops, the amplification signal AOUT having a logic high level may be output through the positive output node OP21, and the complementary amplification signal AOUTB having a logic low level may be output through the negative output node ON21. When the input signal IN has a lower voltage level than the reference voltage VREF, the differential circuit 312 may drop the voltage level of the positive output node OP21 by increasing the amount of current that flows from the positive output node OP21 to the common node CN. As the voltage level of the positive output node OP21 drops, the amplification signal AOUT having a logic low level may be output through the positive output node OP21, and the complementary amplification signal AOUTB having a logic high level may be output through the negative output node ON21.

The precharge driver 313 may be coupled between the positive output node OP21 and the negative output node ON21, and a terminal to which a first voltage VH is supplied. The precharge driver 313 may receive the second clock signal CLK and the precharge control signal KBC, and may precharge the positive output node OP21 and the negative output node ON21 to the voltage level of the first voltage VH based on the second clock signal CLK and the precharge control signal KBC. The first voltage VH may have a higher voltage level than the second voltage VL. The precharge driver 313 may precharge the positive output node OP21 and the negative output node ON21 to the voltage level of the first voltage VH based on the second clock signal CLK, and may adjust a current driving force that precharges the amplification signal AOUT and the complementary amplification signal AOUTB and/or a current driving force that drives the positive output node OP21 and the negative output node ON21 to the voltage level of the first voltage VH based on the precharge control signal KBC. When the precharge control signal KBC is enabled, the precharge driver 313 may increase the current driving force that precharges the amplification signal AOUT and the complementary amplification signal AOUTB and/or the current driving force that drives the positive output node OP21 and the negative output node ON21 to the voltage level of the first voltage VH. When the precharge control signal KBC is disabled, the precharge driver 313 may decrease the current driving force that precharges the amplification signal AOUT and the complementary amplification signal AOUTB and/or the current driving force that drives the positive output node OP21 and the negative output node ON21 to the voltage level of the first voltage VH.

The precharge driver 313 may include a first driver 313-1 (i.e., identified as 313/313-1) and a second driver 313-2 (i.e., identified as 313/313-2). The first driver 313-1 may be coupled between the positive output node OP21 and the negative output node ON21, and a terminal to which the first voltage VH is supplied. The first driver 313-1 may receive the second clock signal CLK, and may drive and/or precharge the positive output node OP21 and the negative output node ON21 to the voltage level of the first voltage VH based on the second clock signal CLK. The second driver 313-2 may be coupled between the positive output node OP21 and the negative output node ON21, and the terminal to which the first voltage VH is supplied. The second driver 313-2 may receive the second clock signal CLK and the precharge control signal KBC, and may drive and/or precharge the positive output node OP21 and the negative output node ON21 to the voltage level of the first voltage VH based on the second clock signal CLK and the precharge control signal KBC.

The enable circuit 311 may include a first transistor T31. The first transistor T31 may be an N channel MOS transistor. The first transistor T31 may receive the second clock signal CLK through a gate thereof. A drain of the first transistor T31 may be coupled to the common node CN. A source of the first transistor T31 may be coupled to a terminal to which the second voltage VL is supplied.

The differential circuit 312 may include a second transistor T32 and a third transistor T33. The second and third transistors T32 and T33 may each be an N channel MOS transistor. The second transistor T32 may receive the input signal IN through a gate thereof. A drain of the second transistor T32 may be coupled to the negative output node ON21. A source of the second transistor T32 may be coupled to the common node CN. The third transistor T33 may receive the reference voltage VREF through a gate thereof. A drain of the third transistor T33 may be coupled to the positive output node OP21. A source of the third transistor 323 may be coupled to the common node CN.

The first driver 313-1 may include a fourth transistor T34 and a fifth transistor T35. The fourth and fifth transistors T34 and T35 may each be a P channel MOS transistor. The fourth transistor T34 may receive the second clock signal CLK through a gate thereof. A source of the fourth transistor T34 may be coupled to the terminal to which the second voltage VH is supplied. A drain of the fourth transistor T34 may be coupled to the negative output node ON21. The fifth transistor T35 may receive the second clock signal CLK through a gate thereof. A source of the fifth transistor T35 may be coupled to the terminal to which the second voltage VH is supplied. A drain of the fifth transistor T35 may be coupled to the positive output node OP21.

The second driver 313-2 may include a sixth transistor T36, a seventh transistor T37, an eighth transistor T38, and a ninth transistor T39. The sixth to ninth transistors T36, T37, T38, and T39 may each be a P channel MOS transistor. The sixth transistor T36 may receive the second clock signal CLK through a gate thereof. A source of the sixth transistor T36 may be coupled to the terminal to which the second voltage VH is supplied. The seventh transistor T37 may receive the second clock signal CLK through a gate thereof. A source of the seventh transistor T37 may be coupled to the terminal to which the second voltage VH is supplied. The eighth transistor T38 may receive the precharge control signal KBC through a gate thereof. A source of the eighth transistor T38 may be coupled to a drain of the sixth transistor T36. A drain of the eighth transistor T38 may be coupled to the negative output node ON21. The ninth transistor T39 may receive the precharge control signal KBC through a gate thereof. A source of the ninth transistor T39 may be coupled to a drain of the seventh transistor T37. A drain of the ninth transistor T39 may be coupled to the positive output node OP21.

Figure 3B:
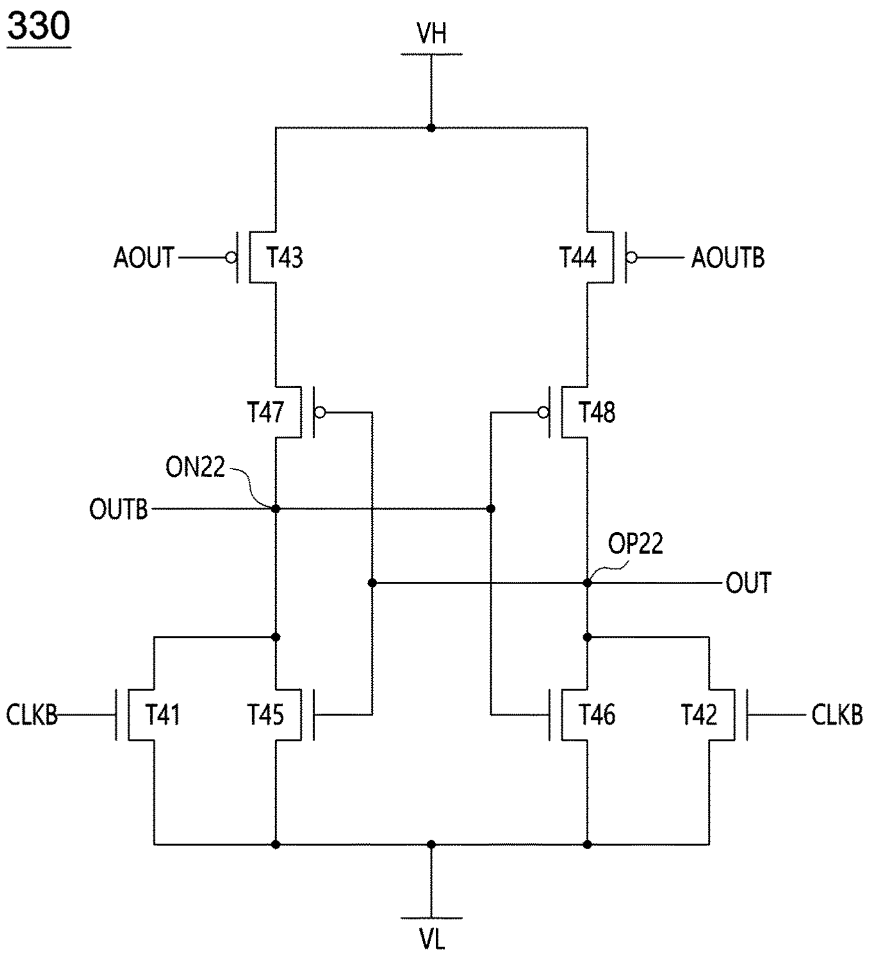
FIG. 3B is a diagram illustrating a configurations of a latch circuit according to an embodiment.

FIG. 3B is a diagram illustrating a configurations of a latch circuit 330 according to an embodiment. The latch circuit 330 may operate by being coupled to the amplifier 310 illustrated in FIG. 3A. The latch circuit 330, together with the amplifier 310 and the precharge control circuit 320, may constitute the amplification circuit 300. The amplifier 310 may operate as a first stage. The latch circuit 330 may operate as a second stage. The latch circuit 330 may generate an output signal OUT and a complementary output signal OUTB by receiving the amplification signal AOUT and the complementary amplification signal AOUTB from the amplifier 310. The latch circuit 330 may change the voltage levels of the output signal OUT and the complementary output signal OUTB and maintain the voltage levels of the output signal OUT and the complementary output signal OUTB, based on the amplification signal AOUT and the complementary amplification signal AOUTB. The latch circuit 330 may receive a first clock signal CLKB. The latch circuit 330 may perform amplification and latch operations based on the first clock signal CLKB. When the first clock signal CLKB has a first logic level, the latch circuit 330 may precharge the output signal OUT and the complementary output signal OUTB. When the first clock signal CLKB has a second logic level, the latch circuit 330 may change the voltage levels of the output signal OUT and the complementary output signal OUTB, based on the voltage levels of the positive output node OP22 and/or the amplification signal AOUT and the negative output node ON22 and/or the complementary amplification signal AOUTB.

The latch circuit 330 may include a first transistor T41, a second transistor T42, a third transistor T43, a fourth transistor T44, a fifth transistor T45, a sixth transistor T46, a seventh transistor T47, and an eighth transistor T48. The latch circuit 330 may be a P type latch circuit in which transistors that receive the amplification signal AOUT and the complementary amplification signal AOUTB are P channel MOS transistors, respectively. The first, second, fifth, and sixth transistors T41, T42, T45, and T46 may each be an N channel MOS transistor. The third, fourth, seventh, and eighth transistors T43, T44, T47, and T48 may each be a P channel MOS transistor. The first transistor T41 may receive the first clock signal CLKB through a gate thereof. A drain of the first transistor T41 may be coupled to a negative output node ON22. A source of the first transistor T41 may be coupled to the terminal to which the second voltage VL is supplied. The second transistor T42 may receive the first clock signal CLKB through a gate thereof. A drain of the second transistor T42 may be coupled to a positive output node OP22. A source of the second transistor T42 may be coupled to the terminal to which the second voltage VL is supplied. The output signal OUT may be output from the positive output node OP22. The complementary output signal OUTB may be output from the negative output node ON22.

The third transistor T43 may receive the amplification signal AOUT through a gate thereof. A source of the third transistor T43 may be coupled to the terminal to which the first voltage VH is supplied. The fourth transistor T44 may receive the complementary amplification signal AOUTB through a gate thereof. A source of the fourth transistor T44 may be coupled to the terminal to which the first voltage VH is supplied. A gate of the fifth transistor T45 may be coupled to the positive output node OP22. A drain of the fifth transistor T45 may be coupled to the negative output node ON22. A source of the fifth transistor T45 may be coupled to the terminal to which the second voltage VL is supplied. A gate of the sixth transistor T46 may be coupled to the negative output node ON22. A drain of the sixth transistor T46 may be coupled to the positive output node OP22. A source of the sixth transistor T46 may be coupled to the terminal to which the second voltage VL is supplied. A gate of the seventh transistor T47 may be coupled to the positive output node OP22. A source of the seventh transistor T47 may be coupled to a drain of the third transistor T43. A drain of the seventh transistor T47 may be coupled to the negative output node ON22. A gate of the eighth transistor T48 may be coupled to the negative output node ON22. A source of the eighth transistor T48 may be coupled to a drain of the fourth transistor T44. A drain of the eighth transistor T48 may be coupled to the positive output node OP22.

When the first clock signal CLKB has a logic high level, the first and second transistors T41 and T42 may be turned on, and the first and second transistors T41 and T42 may precharge the positive output node OP22 and the negative output node ON22 to the voltage level of the second voltage VL. When the first clock signal CLKB has a logic low level, the first and second transistors T41 and T42 may be turned off, and the latch circuit 330 may change the voltage levels of the positive output node OP22 and the negative output node ON22 based on the voltage levels of the amplification signal AOUT and the complementary amplification signal AOUTB. When the amplification signal AOUT has a higher voltage level than the complementary amplification signal AOUTB, the voltage level of the negative output node ON22 may be lower than the voltage level of the positive output node OP22 because the amount of current that flows through the seventh transistor T47 is smaller than the amount of current that flows through the eighth transistor T48. Accordingly, the positive output node OP22 and/or the output signal OUT may be driven to a logic high level and the negative output node ON22 and/or the complementary output signal OUTB may be driven to a logic low level because the fifth and eighth transistors T45 and T48 maintain a turn-on state. When the amplification signal AOUT has a lower voltage level than the complementary amplification signal AOUTB, the voltage level of the negative output node ON22 may be higher than the voltage level of the positive output node OP22 because the amount of current that flows through the seventh transistor T47 is greater than the amount of current that flows through the eighth transistor T48. Accordingly, the positive output node OP22 and/or the output signal OUT may be driven to a logic low level and the negative output node ON22 and/or the complementary output signal OUTB may be driven to a logic high level because the sixth and seventh transistors T46 and T47 maintain a turn-on state. The latch circuit 330 may maintain the voltage levels of the positive output node OP22 and the negative output node ON22 until the logic level of the first clock signal CLKB is changed to a logic low level.

Figure 4:
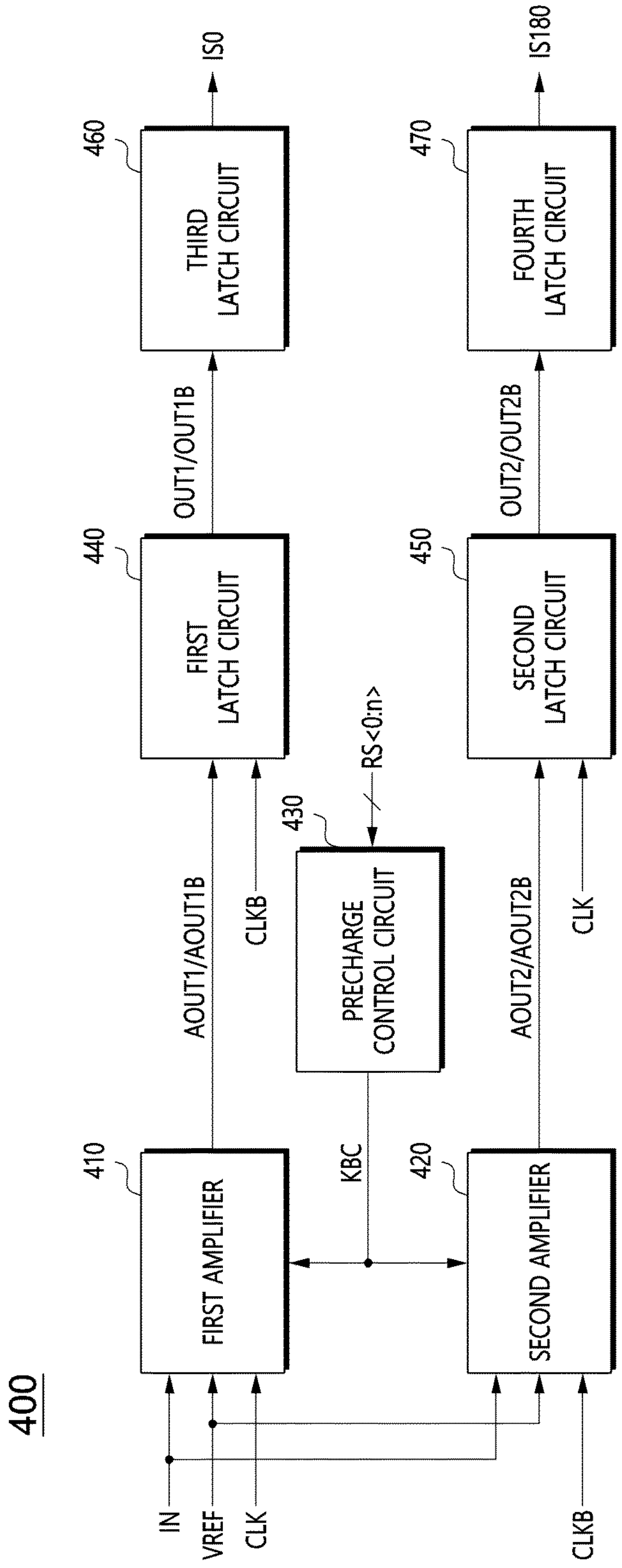
FIG. 4 is a diagram illustrating a configurations of a receiver circuit according to an embodiment.

FIG. 4 is a diagram illustrating a configuration of a receiver circuit 400 according to an embodiment. Referring to FIG. 4, the receiver circuit 400 may generate a first output signal OUT1 and a second output signal OUT2 by receiving a second clock signal CLK, an input signal IN, and a reference voltage VREF. When the second clock signal CLK has a first logic level, the receiver circuit 400 may generate the first output signal OUT1 by differentially amplifying the input signal IN and the reference voltage VREF. When the second clock signal CLK has a second logic level, the receiver circuit 400 may generate the second output signal OUT2 by differentially amplifying the input signal IN and the reference voltage VREF. The receiver circuit 400 may include a first amplifier 410 and a second amplifier 420. The first and second amplifiers 410 and 420 may receive the input signal IN and the reference voltage VREF in common, and may be coupled to a line through which the input signal IN is transmitted and a line through which the reference voltage VREF is transmitted in common. The first amplifier 410 may receive the second clock signal CLK and operate in synchronization with the second clock signal CLK. The second amplifier 420 may receive a first clock signal CLKB and operate in synchronization with the first clock signal CLKB. The first and second amplifiers 410 and 420 may perform amplification operations with different timing. In an embodiment, the first and second amplifiers 410 and 420 may perform amplification operations at different times. An amplifier that does not perform an amplification operation, among the first and second amplifiers 410 and 420, may perform a precharge operation. When the second clock signal CLK has a first logic level, the first amplifier 410 may perform a differential amplification operation and the second amplifier 420 may perform a precharge operation. When the second clock signal CLK has a second logic level, the first amplifier 410 may perform a precharge operation and the second amplifier 420 may perform a differential amplification operation.

The first amplifier 410 may generate a first amplification signal AOUT1, based on the second clock signal CLK, the input signal IN, and the reference voltage VREF. The first amplifier 410 may generate a first complementary amplification signal AOUT1B along with the first amplification signal AOUT1. When the second clock signal CLK has a first logic level, the first amplifier 410 may generate the first amplification signal AOUT1 and the first complementary amplification signal AOUT1B by differentially amplifying the input signal IN and the reference voltage VREF. When the second clock signal CLK has a second logic level, the first amplifier 410 may precharge the first amplification signal AOUT1 and the first complementary amplification signal AOUT1B. The first amplifier 410 may adjust a current driving force that precharges the first amplification signal AOUT1 and the first complementary amplification signal AOUT1B based on the voltage level of the reference voltage VREF. The first amplifier 410 may include one of the amplifiers 100 and 300 illustrated in FIGS. 1A and 3A.

The second amplifier 420 may generate a second amplification signal AOUT2, based on the first clock signal CLKB, the input signal IN, and the reference voltage VREF. The second amplifier 420 may generate a second complementary amplification signal AOUT2B along with the second amplification signal AOUT2. When the first clock signal CLKB has a first logic level, the second amplifier 420 may generate the second amplification signal AOUT2 and the second complementary amplification signal AOUT2B by differentially amplifying the input signal IN and the reference voltage VREF. When the first clock signal CLKB has a second logic level, the second amplifier 420 may precharge the second amplification signal AOUT2 and the second complementary amplification signal AOUT2B. The second amplifier 420 may adjust a current driving force that precharges the second amplification signal AOUT2 and the second complementary amplification signal AOUT2B based on the voltage level of the reference voltage VREF. The second amplifier 420 may include one of the amplifiers 110 and 310 illustrated in FIGS. 1A and 3A. The first and second amplifiers 410 and 420 may be the same type of amplifier. For example, when the first amplifier 410 includes a P type amplifier, the second amplifier 420 may also include a P type amplifier. When the first amplifier 410 includes an N type amplifier, the second amplifier 420 may also include an N type amplifier.

The receiver circuit 400 may further include a precharge control circuit 430. The precharge control circuit 430 may generate a precharge control signal KBC by receiving a reference voltage setting signal RS<0:n>. The precharge control circuit 430 may be substantially the same as the precharge control circuit 120 illustrated in FIG. 1A, and thus a redundant description of the precharge control circuit 430 will be omitted. The first and second amplifiers 410 and 420 may receive the precharge control signal KBC in common. The first amplifier 410 may adjust a current driving force that precharges the first output signal OUT1 based on the precharge control signal KBC. The second amplifier 420 may adjust a current driving force that precharges the second output signal OUT2 based on the precharge control signal KBC. In an embodiment, the precharge control circuit 430 may be integrated to at least one of the first amplifier 410 and the second amplifier 420.

The receiver circuit 400 may further include a first latch circuit 440 and a second latch circuit 450. The first latch circuit 440 may be coupled to the first amplifier 410, and may receive the first amplification signal AOUT1 and the first complementary amplification signal AOUT1B from the first amplifier 410. The first latch circuit 440 may generate the first output signal OUT1 by amplifying and latching the first amplification signal AOUT1 and the first complementary amplification signal AOUT1B. The first latch circuit 440 may generate a first complementary output signal OUT1B along with the first output signal OUT1. The first latch circuit 440 may receive the first clock signal CLKB and operate in synchronization with the first clock signal CLKB. When the first clock signal CLKB has a second logic level, the first latch circuit 440 may precharge the first output signal OUT1 and the first complementary output signal OUT1B. When the first clock signal CLKB has a first logic level, the first latch circuit 440 may generate the first output signal OUT1 and the first complementary output signal OUT1B based on the voltage levels of the first amplification signal AOUT1 and the first complementary amplification signal AOUT1B. The first latch circuit 440 may include one of the latch circuits 130 and 330 illustrated in FIGS. 1B and 3B. When the first amplifier 410 includes the P type amplifier, the latch circuit 440 may include an N type latch circuit. When the first amplifier 410 includes the N type amplifier, the latch circuit 440 may include a P type latch circuit or the N type latch circuit.

The second latch circuit 450 may be coupled to the second amplifier 420, and may receive the second amplification signal AOUT2 and the second complementary amplification signal AOUT2B from the second amplifier 420. The second latch circuit 450 may generate the second output signal OUT2 by amplifying and latching the second amplification signal AOUT2 and the second complementary amplification signal AOUT2B. The second latch circuit 450 may generate a second complementary output signal OUT2B along with the second output signal OUT2. The second latch circuit 450 may receive the second clock signal CLK and operate in synchronization with the second clock signal CLK. When the second clock signal CLK has a second logic level, the second latch circuit 450 may precharge the second output signal OUT2 and the second complementary output signal OUT2B. When the second clock signal CLK has a first logic level, the second latch circuit 450 may generate the second output signal OUT2 and the second complementary output signal OUT2B based on the voltage levels of the second amplification signal AOUT2 and the second complementary amplification signal AOUT2B. The second latch circuit 450 may include one of the latch circuits 130 and 330 illustrated in FIGS. 1B and 3B. When the second amplifier 420 includes the P type amplifier, the second latch circuit 450 may include an N type latch circuit. When the second amplifier 420 includes the N type amplifier, the second latch circuit 450 may include a P type latch circuit or the N type latch circuit.

The receiver circuit 400 may further include a third latch circuit 460 and a fourth latch circuit 470. The third latch circuit 460 may be coupled to the first latch circuit 440, and may receive the first output signal OUT1 from the first latch circuit 440. The third latch circuit 460 may generate a first internal signal IS0 based on the first output signal OUT1. The third latch circuit 460 may generate the first internal signal IS0 by latching the voltage level of the first output signal OUT1. The fourth latch circuit 470 may be coupled to the second latch circuit 450, and may receive the second output signal OUT2 from the second latch circuit 450. The fourth latch circuit 470 may generate a second internal signal IS180 based on the second output signal OUT2. The fourth latch circuit 470 may generate the second internal signal IS180 by latching the voltage level of the second output signal OUT2. The third and fourth latch circuits 460 and 470 may each be implemented by using various latch circuits, such as, for example but not limited to, an SR latch circuit.

Figure 5:
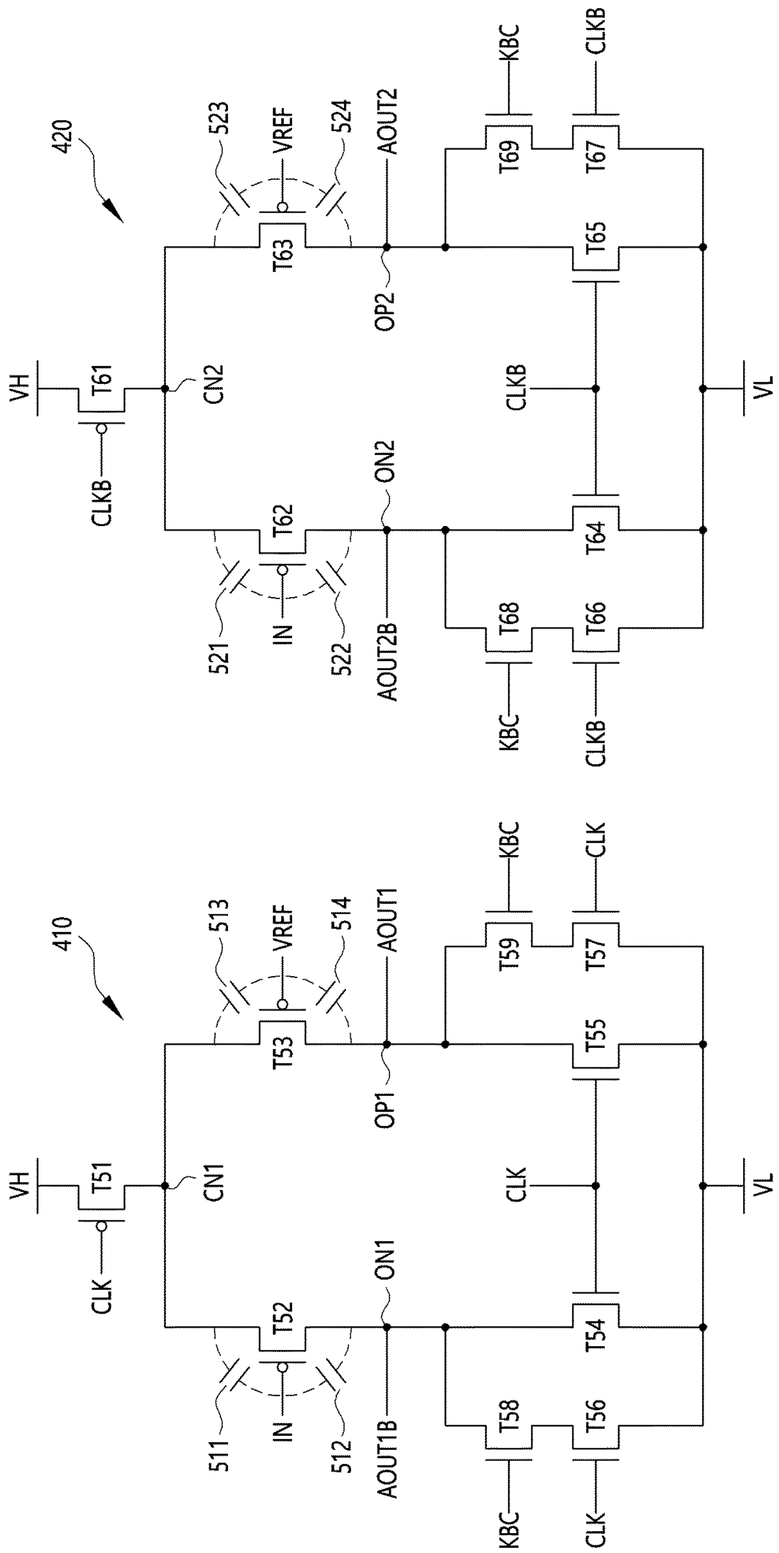
FIG. 5 is a diagram illustrating configurations of a first amplifier and a second amplifier illustrated in FIG. 4 according to an embodiment.

FIG. 5 is a diagram illustrating configurations of the first amplifier 410 and the second amplifier 420 illustrated in FIG. 4. Referring to FIG. 5, the first and second amplifiers 410 and 420 may each include a P type amplifier. The first and second amplifiers 410 and 420 may each have substantially the same configurations as the amplifier 110 illustrated in FIG. 1A. In an embodiment, the first and second amplifiers 410 and 420 may each include an N type amplifier. The first and second amplifiers 410 and 420 may each have substantially the same configurations as the amplifier 310 illustrated in FIG. 3A.

When the second clock signal CLK has a logic low level, a first transistor T51 of the first amplifier 410 may be turned on, fourth to seventh transistors T54, T55, T56, and T57 of the first amplifier 410 may be turned off, and thus the first amplifier 410 may perform a differential amplification operation. The first transistor T51 may apply a first voltage VH to a first common node CN1. A second transistor T52 may change the voltage level of a first negative output node ON1 based on the voltage level of the input signal IN. A third transistor T53 may change the voltage level of a first positive output node OP1 based on the voltage level of the reference voltage VREF. The first amplification signal AOUT1 may be output from the first positive output node OP1. The first complementary amplification signal AOUT1B may be output from the first negative output node ON1. When the second clock signal CLK has a logic low level, a first transistor T61 of the second amplifier 420 may be turned off, fourth to seventh transistors T64, T65, T66, and T67 of the second amplifier 420 may be turned on, and thus the second amplifier 420 may perform a precharge operation. Eighth and ninth transistors T68 and T69 of the second amplifier 420 may be selectively turned on based on the logic level of the precharge control signal KBC. The second amplifier 420 may precharge a second negative output node ON2 and a second positive output node OP2 by driving the second negative output node ON2 and the second positive output node OP2 to the voltage level of the second voltage VL.

When the second clock signal CLK has a logic high level, the first transistor T51 may be turned off, the fourth to seventh transistors T54, T55, T56, and T57 may be turned on, and thus the first amplifier 410 may perform a precharge operation. Eighth and ninth transistors T58 and T59 of the first amplifier 410 may be selectively turned on based on the logic level of the precharge control signal KBC. The first amplifier 410 may precharge the first negative output node ON1 and the first positive output node OP1 by driving the first negative output node ON1 and the first positive output node OP1 to the voltage level of the second voltage VL. When the second clock signal CLK has a logic high level, the first transistor T61 may be turned on, the fourth to seventh transistors T64, T65, T66, and T67 may be turned off, and thus the second amplifier 420 may perform a differential amplification operation. The first transistor T61 may apply the first voltage VH to a second common node CN2. A second transistor T62 may change the voltage level of the second negative output node ON2 based on the voltage level of the input signal IN. A third transistor T63 may change the voltage level of the second positive output node OP2 based on the voltage level of the reference voltage VREF. The second amplification signal AOUT2 may be output from the second positive output node OP2. The second complementary amplification signal AOUT2B may be output from the second negative output node ON2.

A parasitic capacitor 511 may be formed between the line through which the input signal IN is transmitted and the first common node CN1. A parasitic capacitor 512 may also be formed between the line through which the input signal IN is transmitted and the first negative output node ON1. A parasitic capacitor 513 may be formed between the line through which the reference voltage VREF is transmitted and the first common node CN1. A parasitic capacitor 514 may also be formed between the line through which the reference voltage VREF is transmitted and the first positive output node OP2. Likewise, a parasitic capacitor 521 may be formed between the line through which the input signal IN is transmitted and the second common node CN2. A parasitic capacitor 522 may also be formed between the line through which the input signal IN is transmitted and the second negative output node ON2. A parasitic capacitor 523 may be formed between the line through which the reference voltage VREF is transmitted and the second common node CN2. A parasitic capacitor 524 may also be formed between the line through which the reference voltage VREF is transmitted and the second positive output node OP2. The parasitic capacitors 511, 512, 513, and 514 that have been formed in the first amplifier 410 may generate kickback noise in the voltage levels of the input signal IN and the reference voltage VREF, when the logic levels of the second clock signal CLK and the input signal IN transition and thus the voltage levels of the first common node CN1, the first positive output node OP1, and the first negative output node ON1 are changed. The parasitic capacitors 521, 522, 523, and 524 that have been formed in the second amplifier 420 may generate kickback noise in the voltage levels of the input signal IN and the reference voltage VREF, when the logic levels of the first clock signal CLKB and the input signal IN transition and thus the voltage levels of the second common node CN2, the second positive output node OP2, and the second negative output node ON2 are changed. In an embodiment, the kickback noise may reduce a difference between the voltage levels of the input signal IN and the reference voltage VREF by changing the voltage levels of the input signal IN and the reference voltage VREF in an unwanted direction, and may reverse the voltage levels of the input signal IN and the reference voltage VREF in the worst case.

Figure 6A:
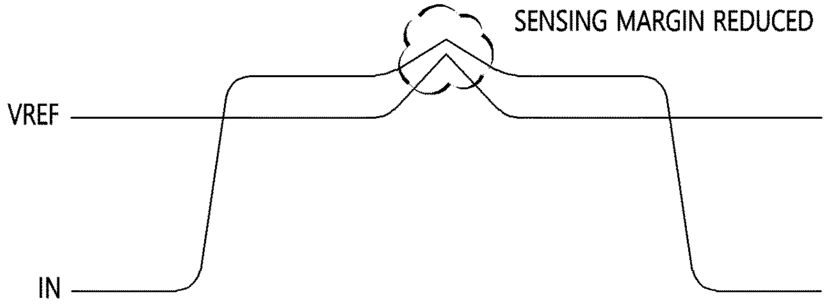
FIGS. 6A, 6B, and 6C are timing diagrams illustrating an operation of the receiver circuit according to an embodiment.
Figure 6B:
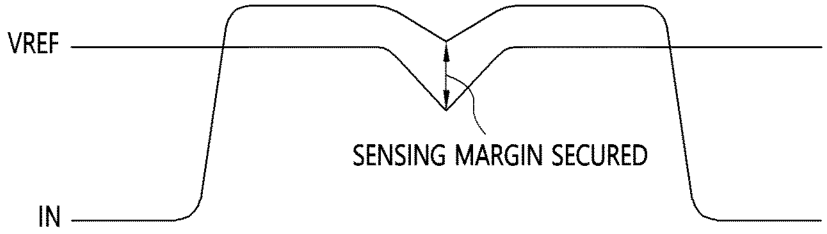
Figure 6C:
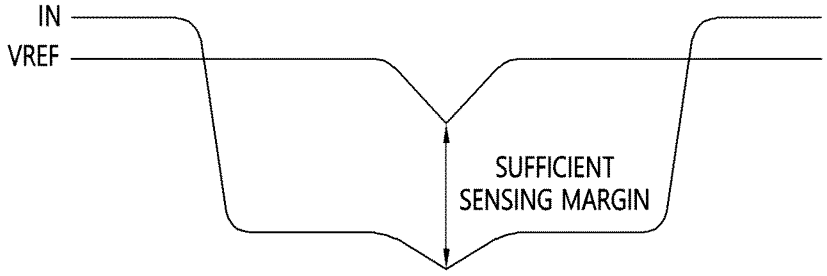

FIGS. 6A to 6C are timing diagrams illustrating an operation of the receiver circuit 400 according to an embodiment. FIGS. 6A to 6C may illustrate operations of the receiver circuit 400 when the second clock signal CLK has a first logic level and the reference voltage VREF has a relatively high voltage level. FIG. 6A may illustrate an operation of the receiver circuit 400 when the precharge control signal KBC is not used. When the second clock signal CLK transitions from a logic high level to a logic low level and the input signal IN transitions from a logic low level to a logic high level, the first voltage VH may be applied to the first common node CN1, and the voltage level of the first positive output node OP1 may rise higher than the voltage level of the first negative output node ON1 based on the voltage levels of the input signal IN and the reference voltage VREF. At this time, in an embodiment, the voltage levels of the input signal IN and the reference voltage VREF may rise due to voltage boosting and/or kickback noise attributable to the parasitic capacitors 511, 512, 513, and 514. Based on information that is included in the input signal IN, the input signal IN may be generated to have a logic level and/or a voltage level changed, whereas the reference voltage VREF may be generated to maintain a constant voltage level. Accordingly, in an embodiment, a variation in the voltage level of the reference voltage VREF attributable to the kickback noise may be greater than a variation in the voltage level of the input signal IN. IN an embodiment, when the voltage level of the reference voltage VREF rises higher than the voltage level of the input signal IN, a difference between the voltage levels of the input signal IN and the reference voltage VREF may be reduced, and a sensing margin of the first amplifier 410 may be decreased. In an embodiment, when a sensing margin between the input signal IN and the reference voltage VREF is reduced, the first amplifier 410 might not generate the first amplification signal AOUT1 corresponding to the input signal IN. Accordingly, in an embodiment, the voltage level of the first amplification signal AOUT1 may become a meta state or may be driven to a logic level that is opposite to the logic level of the input signal IN.

FIG. 6B may illustrate an operation of the receiver circuit 400 when the precharge control signal KBC is used. Referring to FIG. 6B, when the reference voltage VREF has a relatively high voltage level, the precharge control circuit 430 may enable the precharge control signal KBC. When the precharge control signal KBC is enabled, the second amplifier 420 may increase a current driving force that precharges the second amplification signal OUT2 and the second complementary amplification signal AOUT2B. When the precharge control signal KBC is enabled, both the eighth and ninth transistors T68 and T69 may be turned on, and the sixth to ninth transistors T66, T67, T68, and T69 in addition to the fourth and fifth transistors T64 and T65 may precharge the second negative output node ON2 and the second positive output node OP2 to the voltage level of the second voltage VL. In an embodiment, if the second positive output node OP2 and the second negative output node ON2 are sufficiently driven by the fourth to ninth transistors T64, T65, T66, T67, T68, and T69, the voltage levels of the input signal IN and the reference voltage VREF may drop due to voltage boosting and/or kickback noise attributable to the parasitic capacitors 522 and 524. Accordingly, in an embodiment, the kickback noise attributable to the parasitic capacitors 522 and 524 may offset kickback noise attributable to the capacitors 511, 512, 513, and 514, and may additionally drop the voltage levels of the reference voltage VREF and the input signal IN. Accordingly, in an embodiment, at timing at which the kickback noise occurs, the voltage levels of the input signal IN and the reference voltage VREF may be compensated for, a difference between the voltage levels of the input signal IN and the reference voltage VREF may be increased, and a sensing margin of the first amplifier 410 may be secured. In an embodiment, the first amplifier 410 may generate the first amplification signal AOUT1 having a logic level corresponding to the input signal IN because the first amplifier 410 differentially amplifies the input signal IN and the reference voltage VREF having the secured sensing margin.

FIG. 6C may illustrate an operation of the receiver circuit 400 when the second clock signal CLK transitions from a logic high level to a logic low level and the input signal IN transitions from a logic high level to a logic low level. Referring to FIG. 6C, the first voltage VH may be supplied to the first common node CN1. The voltage level of the first negative output node ON1 may rise higher than the voltage level of the first positive output node OP1 based on the voltage levels of the input signal IN and the reference voltage VREF. Accordingly, in an embodiment, kickback noise attributable to the parasitic capacitors 511, 512, 513, and 514 may raise the voltage levels of the input signal IN and the reference voltage VREF. At this time, in an embodiment, the fourth to ninth transistors T64, T65, T66, T67, T68, and T69 may precharge the second positive output node OP2 and the second negative output node ON2, and kickback noise attributable to the parasitic capacitors 522 and 524 may drop the voltage levels of the input signal IN and the reference voltage VREF. In an embodiment, as the kickback noise attributable to the parasitic capacitors 522 and 524 compensates for the kickback noise attributable to the parasitic capacitors 511, 512, 513, and 514, the voltage levels of the input signal IN and the reference voltage VREF may drop. In an embodiment, when the voltage level of the reference voltage VREF is relatively high, a sufficient sensing margin can be secured between the input signal IN and the reference voltage VREF regardless of whether kickback noise occurs.

Figure 7A:
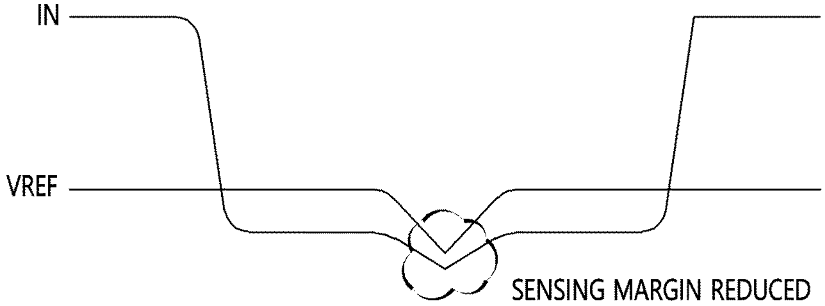
FIGS. 7A, 7B, and 7C are timing diagrams illustrating an operation of the receiver circuit according to an embodiment.
Figure 7B:
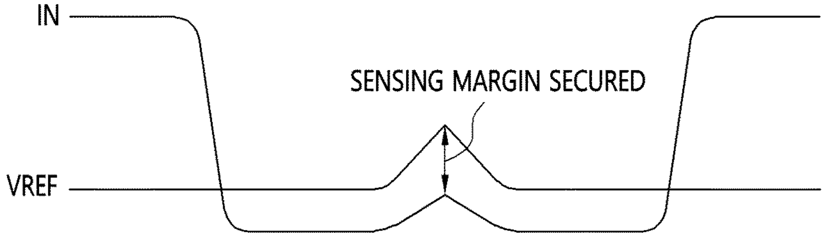
Figure 7C:
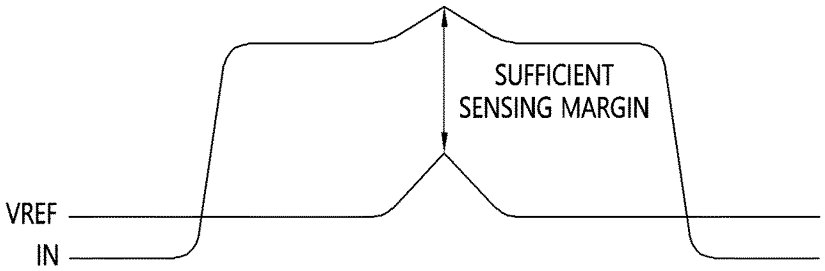

FIGS. 7A to 7C are timing diagrams illustrating operations of the receiver circuit 400 according to an embodiment. FIGS. 7A to 7C may illustrate operations of the receiver circuit 400 when the second clock signal CLK has a first logic level and the reference voltage VREF has a relatively low voltage level. FIG. 7A may illustrate an operation of the receiver circuit 400 when the precharge control signal KBC is not used. When the second clock signal CLK transitions from a logic high level to a logic low level and the input signal IN transitions from a logic high level to a logic low level, the first voltage VH may be applied to the first common node CN1, and the voltage level of the first positive output node OP1 may drop lower than the voltage level of the first negative output node ON1 based on the voltage levels of the input signal IN and the reference voltage VREF. In an embodiment, the voltage levels of the input signal IN and the reference voltage VREF may rise due to voltage boosting and/or kickback noise attributable to the parasitic capacitors 511, 512, 513, and 514. At this time, in an embodiment, when the second amplifier 420 precharges the second positive output node OP2 and the second negative output node ON2, the voltage levels of the input signal IN and the reference voltage VREF may drop. In an embodiment, when the voltage level of the reference voltage VREF drops lower than the voltage level of the input signal IN, a difference between the voltage levels of the reference voltage VREF and the input signal IN may be reduced, and a sensing margin of the first amplifier 410 may be decreased. In an embodiment, when a sensing margin between the reference voltage VREF and the input signal IN is reduced, the first amplifier 410 might not generate the first amplification signal AOUT1 corresponding to the input signal IN. Accordingly, in an embodiment, the voltage level of the first amplification signal AOUT1 may become a meta state or there may be a possibility that the first amplification signal AOUT1 may be driven to a logic level that is opposite to the logic level of the input signal IN.

FIG. 7B may illustrate an operation of the receiver circuit 400 when the precharge control signal KBC is used. Referring to FIG. 7B, when the reference voltage VREF has a relatively low voltage level, the precharge control circuit 430 may disable the precharge control signal KBC. When the precharge control signal KBC is disabled, the second amplifier 420 may decrease a current driving force that precharges the second amplification signal AOUT2. When the precharge control signal KBC is disabled, both the eighth and ninth transistors T68 and T69 may be turned off, and only the fourth and fifth transistors T64 and T65 may precharge the second negative output node ON2 and the second positive output node OP2 to the voltage level of the second voltage VL. In an embodiment, when the second positive output node OP2 and the second negative output node ON2 are less driven by the fourth and fifth transistors T64 and T65, kickback noise attributable to the parasitic capacitors 522 and 524 might not fully offset kickback noise attributable to the parasitic capacitors 511, 512, 513, and 514, and the voltage levels of the reference voltage VREF and the input signal IN may rise. Accordingly, in an embodiment, at timing at which the kickback noise occurs, the voltage levels of the input signal IN and the reference voltage VREF may rise, a difference between the voltage levels of the input signal IN and the reference voltage VREF may be increased, and a sensing margin of the first amplifier 410 may be secured. In an embodiment, the first amplifier 410 may generate the first amplification signal AOUT1 having a logic level corresponding to the input signal IN because the first amplifier 410 differentially amplifies the input signal IN and the reference voltage VREF having the secured sensing margin.

FIG. 7C may illustrate an operation of the receiver circuit 400 when the second clock signal CLK transitions from a logic high level to a logic low level and the input signal IN transitions from a logic low level to a logic high level. Referring to FIG. 7C, the first voltage VH may be supplied to the first common node CN1. The voltage level of the first negative output node ON1 may rise higher than the voltage level of the first positive output node OP1 based on the voltage levels of the input signal IN and the reference voltage VREF. Kickback noise attributable to the parasitic capacitors 511, 512, 513, and 514 may raise the voltage levels of the input signal IN and the reference voltage VREF. In an embodiment, the fourth and fifth transistors T64 and T65 of the second amplifier 420 may precharge the second positive output node ON2 and the second negative output node OP2. In an embodiment, kickback noise attributable to the parasitic capacitors 522 and 524 may drop the voltage levels of the input signal IN and the reference voltage VREF. In an embodiment, the voltage levels of the input signal IN and the reference voltage VREF may rise because the kickback noise attributable to the parasitic capacitors 522 and 524 is greater than the kickback noise attributable to the parasitic capacitors 511, 512, 513, and 514. In an embodiment, when the voltage level of the reference voltage VREF is relatively low, a sufficient sensing margin may be secured between the input signal IN and the reference voltage VREF regardless of the kickback noise.

Figure 8:
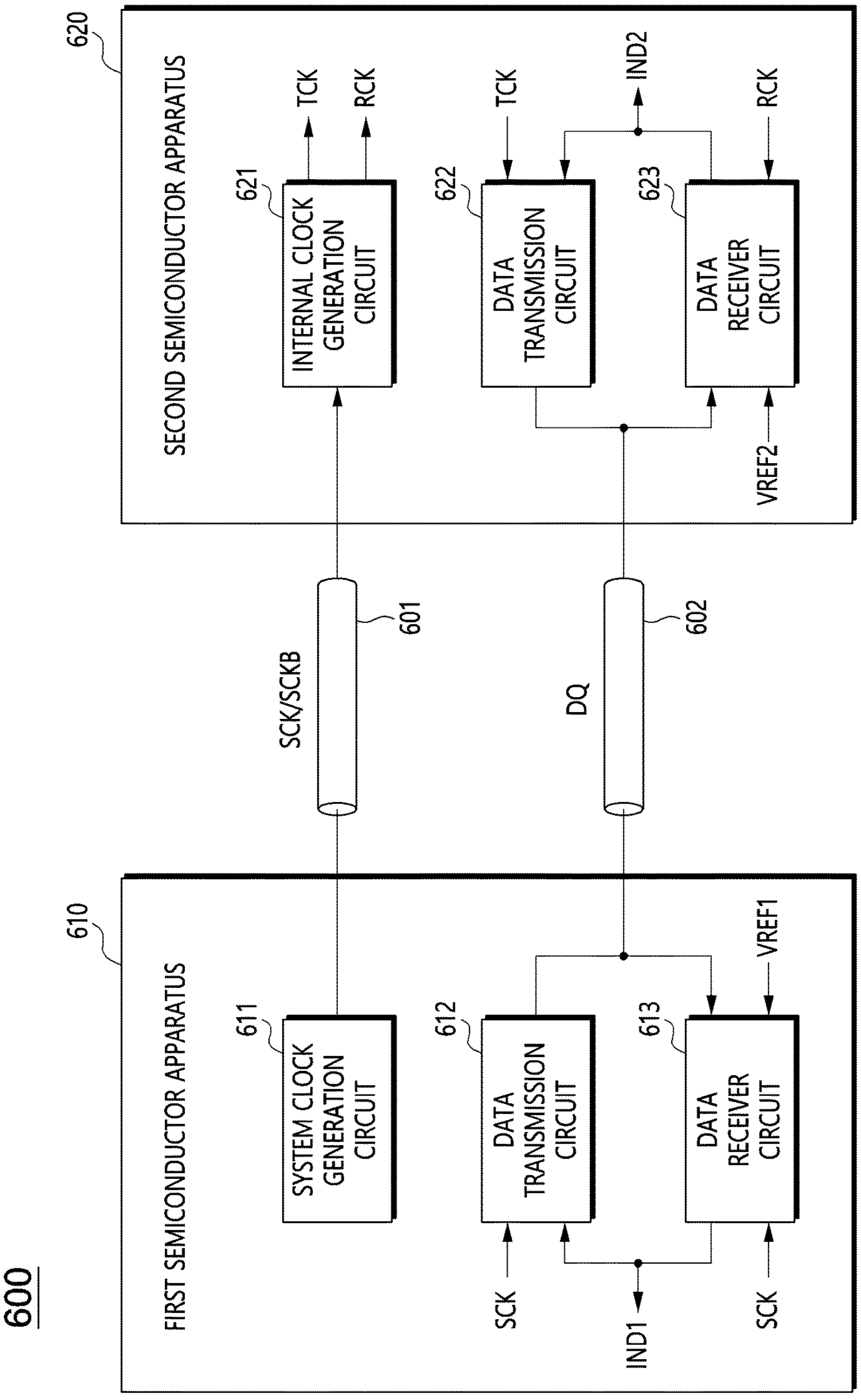
FIG. 8 is a diagram illustrating a configurations of a semiconductor system according to an embodiment.

FIG. 8 is a diagram illustrating configurations of a semiconductor system according to an embodiment. Referring to FIG. 8, a semiconductor system 600 may include a first semiconductor apparatus 610 and a second semiconductor apparatus 620. The first semiconductor apparatus 610 may be a master apparatus that provides various control signals that are necessary for the second semiconductor apparatus 620 to operate. The first semiconductor apparatus 610 may include various types of apparatuses. For example, the first semiconductor apparatus 610 may be a host apparatus, such as a central processing unit (CPU), a graphic processing unit (GPU), a multi-media processor (MMP), a digital signal processor, an application processor (AP), and a memory controller. The second semiconductor apparatus 620 may be a slave apparatus capable of performing various operations based on a control signal that is provided by the first semiconductor apparatus 610. The second semiconductor apparatus 620 may be a memory apparatus, for example. The memory apparatus may include volatile memory and non-volatile memory. The volatile memory may include static RAM (SRAM), dynamic RAM (DRAM), and synchronous DRAM (SDRAM). The nonvolatile memory may include read only memory (ROM), programmable ROM (PROM), electrically erasable programmable ROM (EEPROM), erasable programmable ROM (EPROM), flash memory, phase change RAM (PRAM), magnetic RAM (MRAM), resistive RAM (RRAM), and ferroelectric RAM (FRAM).

The second semiconductor apparatus 620 may be coupled to the first semiconductor apparatus 610 through a plurality of buses. The plurality of buses may each be a signal transmission path, a link, or a channel for transmitting a signal. The plurality of buses may include a clock bus 601 and a data bus 602. The clock bus 601 may be a unidirectional bus from the first semiconductor apparatus 610 to the second semiconductor apparatus 620. The data bus 602 may be a bi-directional bus. Although not illustrated, the semiconductor system 600 may further include a command bus and an address bus for transmitting a command signal and an address signal from the first semiconductor apparatus 610 to the second semiconductor apparatus 620. The second semiconductor apparatus 620 may be coupled to the first semiconductor apparatus 610 through the clock bus 601, and may receive a system clock signal SCK from the first semiconductor apparatus 610 through the clock bus 601. The system clock signal SCK may be transmitted as a single-ended signal, and may be transmitted as a differential signal along with the complementary system clock signal SCKB. The second semiconductor apparatus 620 may be coupled to the first semiconductor apparatus 610 through the data bus 602, and may receive data DQ from the first semiconductor apparatus 610 or transmit data DQ to the first semiconductor apparatus 610 through the data bus 602.

The first semiconductor apparatus 610 may include a system clock generation circuit 611, a data transmission circuit 612, and a data receiver circuit 613. The system clock generation circuit 611 may generate the system clock signal SCK. The system clock generation circuit 611 may provide the system clock signal SCK to the second semiconductor apparatus 620 through the clock bus 601. The system clock generation circuit 611 may transmit the complementary system clock signal SCKB along with the system clock signal SCK. The system clock generation circuit 611 may include a clock generation circuit, such as an oscillator, a delay-locked loop circuit, or a phase-locked loop circuit. The system clock generation circuit 611 may provide the system clock signal SCK to the data transmission circuit 612 and the data receiver circuit 613. In an embodiment, the system clock generation circuit 611 may delay the system clock signal SCK by a required delay time, and may provide the delayed clock signal to the data transmission circuit 612 and the data receiver circuit 613.

The data transmission circuit 612 may receive internal data signal IND1 of the first semiconductor apparatus 610, and may receive the system clock signal SCK from the system clock generation circuit 611. The data transmission circuit 612 may generate the data DQ from the internal data signal IND1 in synchronization with the system clock signal SCK. The data transmission circuit 612 may transmit the data DQ through the data bus 602 by driving the data bus 602 based on the logic level of the internal data signal IND1 in synchronization with the system clock signal SCK. The data receiver circuit 613 may receive the data DQ through the data bus 602, and may receive the system clock signal SCK from the system clock generation circuit 611. The data receiver circuit 613 may receive a first reference voltage VREF1. The data receiver circuit 613 may generate the internal data signal IND1 by differentially amplifying the data signal DQ and the first reference voltage VREF1 in synchronization with the system clock signal SCK. When the system clock signal SCK has a first logic level, the data receiver circuit 613 may generate an odd-numbered bit of the internal data signal IND1 by differentially amplifying the data signal DQ and the first reference voltage VREF1. When the system clock signal SCK has a second logic level, the data receiver circuit 613 may generate an even-numbered bit of the internal data signal IND1 by differentially amplifying the data signal DQ and the first reference voltage VREF1. The receiver circuit 400 illustrated in FIG. 4 may be applied as the data receiver circuit 613.

The second semiconductor apparatus 620 may include an internal clock generation circuit 621, a data transmission circuit 622, and a data receiver circuit 623. The internal clock generation circuit 621 may be coupled to the clock bus 601, and may receive the system clock signal SCK and the complementary system clock signal SCKB that are transmitted through the clock bus 601. The internal clock generation circuit 621 may generate a reference clock signal by buffering the system clock signal SCK and the complementary system clock signal CKB, and may generate a plurality of internal clock signals by dividing the frequency of the reference clock signal. The plurality of internal clock signals may include a transmission clock signal TCK and a reception clock signal RCK. Both the transmission clock signal TCK and the reception clock signal RCK may be synchronized with the reference clock signal. The transmission clock signal TCK and the reception clock signal RCK may have the same phase or may have different phases. In an embodiment, the internal clock generation circuit 621 may include a delay-locked loop circuit, and may generate the transmission clock signal TCK and the reception clock signal RCK by performing a delay-locked operation on the reference clock signal. The internal clock generation circuit 621 may provide the transmission clock signal TCK to the data transmission circuit 622 and provide the reception clock signal RCK to the data receiver circuit 623.

The data transmission circuit 622 may receive an internal data signal IND2 of the second semiconductor apparatus 620, and may receive the transmission clock signal TCK from the internal clock generation circuit 621. The data transmission circuit 622 may generate the data DQ from the internal data signal IND2 in synchronization with the transmission clock signal TCK. The data transmission circuit 622 may transmit the data DQ through the data bus 602 by driving the data bus 602 based on the logic level of the internal data signal IND2 in synchronization with the transmission clock signal TCK. The data receiver circuit 623 may receive the data DQ through the data bus 602 and receive the reception clock signal RCK from the internal clock generation circuit 621. The data receiver circuit 623 may receive a second reference voltage VREF2. The second reference voltage VREF2 may have substantially the same voltage level as the first reference voltage VREF1 or may have a voltage level different from the voltage level of the first reference voltage VREF1. The data receiver circuit 623 may generate the internal data signal IND2 by differentially amplifying the data signal DQ and the second reference voltage VREF2 in synchronization with the reception clock signal RCK. When the reception clock signal RCK has a first logic level, the data receiver circuit 623 may generate an odd-numbered bit of the internal data signal IND2 by differentially amplifying the data signal DQ and the second reference voltage VREF2. When the reception clock signal RCK has a second logic level, the data receiver circuit 623 may generate an even-numbered bit of the internal data signal IND2 by differentially amplifying the data signal DQ and the second reference voltage VREF2. The receiver circuit 400 illustrated in FIG. 4 may be applied as the data receiver circuit 623.

Those skilled in the art to which the present technology pertains may understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. An amplification circuit comprising:

a precharge control circuit configured to receive a reference voltage and to generate a precharge control signal based on a voltage level of the reference voltage; and an amplifier configured to receive a clock signal, an input signal, and the reference voltage to differentially amplify the input signal and the reference voltage to change voltage levels of a positive output node and a negative output node when the clock signal has a first logic level, to precharge the positive output node and the negative output node when the clock signal has a second logic level, and to adjust a current driving force that precharges the positive output node and the negative output node based on the precharge control signal.

2. The amplification circuit of claim 1, wherein the precharge control circuit is configured to receive a reference voltage setting signal, and to compare the reference voltage setting signal and a threshold value to generate the precharge control signal.

3. The amplification circuit of claim 1, wherein the amplifier is configured to increase the current driving force that precharges the positive output node and the negative output node when the precharge control signal is enabled, and to decrease the current driving force that precharges the positive output node and the negative output node when the precharge control signal is disabled.

4. The amplification circuit of claim 1, wherein the amplifier comprises:

an enable circuit configured to apply a first voltage to a common node based on the clock signal;

an input circuit coupled between the common node, and the positive output node and the negative output node and configured to change the voltage levels of the positive output node and the negative output node based on voltage levels of the input signal and the reference voltage; and a precharge driver configured to precharge the positive output node and the negative output node to a voltage level of a second voltage based on the clock signal and the precharge control signal.

5. The amplification circuit of claim 4, wherein the precharge driver comprises:

a first driver configured to drive the positive output node and the negative output node to the voltage level of the second voltage based on the clock signal; and a second driver configured to drive the positive output node and the negative output node to the voltage level of the second voltage based on the clock signal and the precharge control signal.

6. The amplification circuit of claim 1, further comprising a latch circuit configured to precharge an output signal when the clock signal has the first logic level and to generate the output signal based on the voltage levels of the positive output node and the negative output node when the clock signal has the second logic level.

7. An amplification circuit comprising:

an enable circuit configured to receive a clock signal and to apply a first voltage to a common node when the clock signal has a first logic level;

an input circuit coupled between the common node, and a positive output node and a negative output node, configured to receive an input signal and a reference voltage, and configured to change voltage levels of the positive output node and the negative output node based on the input signal and the reference voltage; and a precharge circuit configured to precharge the positive output node and the negative output node to a voltage level of a second voltage when the clock signal has a second logic level and to adjust a current driving force that precharges the positive output node and the negative output node based on a voltage level of the reference voltage.

8. The amplification circuit of claim 7, wherein:

the first voltage has a higher voltage level than the second voltage, and the precharge circuit increases the current driving force when the reference voltage has a higher voltage level than a threshold value and decreases the current driving force when the reference voltage has a lower voltage level than the threshold value.

9. The amplification circuit of claim 7, wherein:

the first voltage has a lower voltage level than the second voltage, and the precharge circuit decreases the current driving force when the reference voltage has a higher voltage level than a threshold value and increases the current driving force when the reference voltage has a lower voltage level than the threshold value.

10. The amplification circuit of claim 7, wherein the precharge circuit comprises:

a precharge control circuit configured to sense the voltage level of the reference voltage to generate a precharge control signal; and a precharge driver configured to drive the positive output node and the negative output node to the voltage level of the second voltage based on the clock signal and the precharge control signal.

11. The amplification circuit of claim 10, wherein the precharge driver comprises:

a first driver configured to drive the positive output node and the negative output node to the voltage level of the second voltage based on the clock signal; and a second driver configured to drive the positive output node and the negative output node to the voltage level of the second voltage based on the clock signal and the precharge control signal.

12. The amplification circuit of claim 7, further comprising a latch circuit configured to precharge an output signal when the clock signal has the first logic level and to generate the output signal based on the voltage levels of the positive output node and the negative output node when the clock signal has the second logic level.

13. A receiver circuit comprising:

a first amplifier configured to receive an input signal, a reference voltage, and a clock signal to differentially amplify the input signal and the reference voltage to generate a first amplification signal when the clock signal has a first logic level, to precharge the first amplification signal when the clock signal has a second logic level, and to adjust a current driving force that precharges the first amplification signal based on a voltage level of the reference voltage; and a second amplifier configured to receive the input signal, the reference voltage, and the clock signal to differentially amplify the input signal and the reference voltage to generate a second amplification signal when the clock signal has the second logic level, to precharge the second amplification signal when the clock signal has the first logic level, and to adjust a current driving force that precharges the second amplification signal based on the voltage level of the reference voltage.

14. The receiver circuit of claim 13, wherein:

each of the first and second amplifiers comprises a P type amplifier, each of the first and second amplifiers configured to increase the current driving force when the reference voltage has a higher voltage level than a threshold value, and each of the first and second amplifiers configured to decrease the current driving force when the reference voltage has a lower voltage level than the threshold value.

15. The receiver circuit of claim 13, wherein:

each of the first and second amplifiers comprises an N type amplifier, each of the first and second amplifiers configured to decrease the current driving force when the reference voltage has a higher voltage level than a threshold value, and each of the first and second amplifiers configured to increase the current driving force when the reference voltage has a lower voltage level than the threshold value.

16. The receiver circuit of claim 13, further comprising a precharge control circuit configured to sense the voltage level of the reference voltage to generate a precharge control signal, wherein each of the first and second amplifiers configured to adjust the current driving force based on the precharge control signal.

17. The receiver circuit of claim 16, wherein the first amplifier comprises:

a first enable circuit configured to apply a first voltage to a first common node based on the clock signal;

a first differential circuit coupled to the first common node, a first positive output node, and a first negative output node and configured to differentially amplify the input signal and the reference voltage to generate the first amplification signal, to output the first amplification signal through the first positive output node, and to output a first complementary amplification signal through the first negative output node; and a first precharge driver configured to precharge the first positive output node and the first negative output node to a voltage level of a second voltage based on the clock signal and to adjust a current driving force that precharges the first positive output node and the first negative output node based on the precharge control signal.

18. The receiver circuit of claim 17, wherein the first precharge driver comprises:

a first driver configured to drive the first positive output node and the first negative output node to the voltage level of the second voltage based on the clock signal; and a second driver configured to drive the first positive output node and the first negative output node to the voltage level of the second voltage based on the clock signal and the precharge control signal.

19. The receiver circuit of claim 16, wherein the second amplifier comprises:

a second enable circuit configured to apply a first voltage to a second common node based on the clock signal;

a second differential circuit coupled to the second common node, a second positive output node, and a second negative output node and configured to differentially amplify the input signal and the reference voltage to generate the second amplification signal, to output the second amplification signal through the second positive output node, and to output the second complementary amplification signal through the second negative output node; and a second precharge driver configured to precharge the second positive output node and the second negative output node to a voltage level of a second voltage based on the clock signal and to adjust a current driving force that precharges the second positive output node and the second negative output node based on the precharge control signal.

20. The receiver circuit of claim 19, wherein the first precharge driver comprises:

a third driver configured to drive the second positive output node and the second negative output node to the voltage level of the second voltage based on the clock signal; and a fourth driver configured to drive the second positive output node and the second negative output node to the voltage level of the second voltage based on the clock signal and the precharge control signal.

21. The receiver circuit of claim 13, further comprising:

a first latch circuit configured to precharge a first output signal when the clock signal has the first logic level and to generate the first output signal based on the first amplification signal when the clock signal has the second logic level; and a second latch circuit configured to precharge a second output signal when the clock signal has the second logic level and to generate the second output signal based on the second amplification signal when the clock signal has the first logic level.

22. The receiver circuit of claim 21, further comprising:

a third latch circuit configured to generate a first internal signal by latching the first output signal; and a fourth latch circuit configured to generate a second internal signal by latching the second output signal.

* * * * *